United States Patent
Fantini et al.

(10) Patent No.: US 11,948,638 B2
(45) Date of Patent: *Apr. 2, 2024

(54) TECHNIQUES FOR PARALLEL MEMORY CELL ACCESS

(71) Applicant: Micron Technology, Inc., Boise, ID (US)

(72) Inventors: Paolo Fantini, Vimercate (IT); Andrea Martinelli, Bergamo (IT); Maurizio Rizzi, Cologno Monzese (IT)

(73) Assignee: Micron Technology, Inc., Boise, ID (US)

( * ) Notice: Subject to any disclaimer, the term of this patent is extended or adjusted under 35 U.S.C. 154(b) by 55 days.

This patent is subject to a terminal disclaimer.

(21) Appl. No.: 17/651,216

(22) Filed: Feb. 15, 2022

(65) Prior Publication Data
US 2023/0260576 A1    Aug. 17, 2023

(51) Int. Cl.
*G11C 16/04* (2006.01)
*G11C 16/08* (2006.01)
*G11C 16/24* (2006.01)
*G11C 16/30* (2006.01)
*G11C 16/34* (2006.01)

(52) U.S. Cl.
CPC .......... *G11C 16/0433* (2013.01); *G11C 16/08* (2013.01); *G11C 16/24* (2013.01); *G11C 16/30* (2013.01); *G11C 16/3404* (2013.01)

(58) Field of Classification Search
None
See application file for complete search history.

(56) References Cited

U.S. PATENT DOCUMENTS

| | | | | |
|---|---|---|---|---|
| 8,934,292 | B2* | 1/2015 | Costa | G11C 13/0007 365/163 |
| 8,996,793 | B1* | 3/2015 | Steiner | H03M 13/3738 711/103 |
| 11,482,284 | B1* | 10/2022 | Pellizzer | G11C 13/0028 |
| 11,487,576 | B2* | 11/2022 | Park | G06F 3/0673 |

OTHER PUBLICATIONS

U.S. Appl. No. 17/238,056, by Pellizzer, filed Apr. 22, 2021 (54 pages).

* cited by examiner

*Primary Examiner* — Kretelia Graham
(74) *Attorney, Agent, or Firm* — Holland & Hart LLP

(57) ABSTRACT

Methods, systems, and devices for techniques for parallel memory cell access are described. A memory device may include multiple tiers of memory cells. During a first duration, a first voltage may be applied to a set of word lines coupled with a tier of memory cells to threshold one or more memory cells included in a first subset of memory cells of the tier. During a second duration, a second voltage may be applied to the set of word lines to write a first logic state to the one or more memory cells of the first subset and to threshold one or more memory cells included in a second subset of memory cells of the tier. During a third duration, a third voltage may be applied to the set of word lines to write a second logic state to the one or more memory cells of the second subset.

25 Claims, 7 Drawing Sheets

SECTION A-A

▨ Unselected Memory Cell 105   ■ Selected Memory Cell 105-a

TECHNIQUES FOR PARALLEL MEMORY CELL ACCESS

FIELD OF TECHNOLOGY

The following relates to one or more systems for memory, including techniques for parallel memory cell access.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory architectures, such as chalcogenide memory, may maintain stored logic states for extended periods of time even in the absence of an external power source. Volatile memory architectures, such as DRAM, may lose stored logic states when disconnected from an external power source.

DETAILED DESCRIPTION

Figure 1:
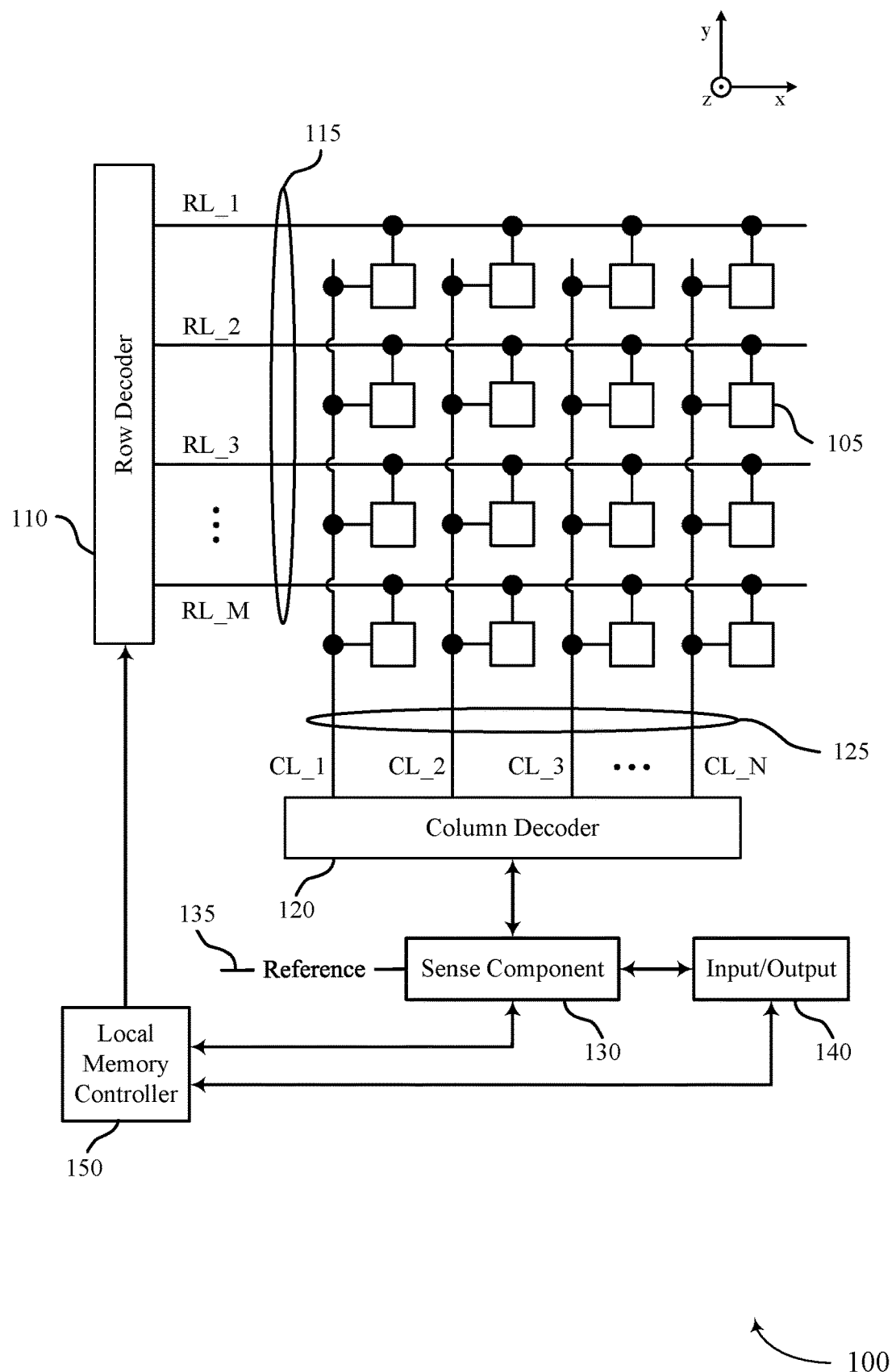
FIG. 1 illustrates an example of a memory array that supports techniques for parallel memory cell access in accordance with examples as disclosed herein.

A memory device may include memory arrays of memory cells that are arranged vertically in a stack (e.g., a three-dimensional (3D) arrangement) of memory arrays (e.g., two-dimensional (2D) arrays). In some examples, each memory array in the stack may be referred to as a tier of memory cells. That is, a memory device may include multiple tiers of memory cells that are arranged in a vertical stack. The memory device may include circuitry to perform access operations (e.g., read operations, write operations) on any given memory cell of any given tier of memory cells. For example, the memory device may include pillars that extend vertically through the tiers of memory cells with each pillar being coupled with one or more memory cells at each tier of memory cells. The memory device may also include bit lines and sets of pillar selectors are configured to couple subsets of pillars to respective bit lines. Additionally, the memory device may include two sets of alternating (e.g., interleaved) word lines at each tier of memory cells that are coupled with the memory cells of a respective tier of memory cells (e.g., a respective memory cell may be coupled between a respective pillar and a respective word line of one of the two sets of word lines). Memory cells may be self-selecting. For example, to access a particular memory cell, voltages may be applied to a corresponding pillar, word line, and bit line such that a state of the memory cell (e.g., a SET state, a RESET state) may be read or written based on the applied voltages, while other pillars, word lines, and bit lines may be set to voltages that do not disturb other memory cells. In some cases, multiple memory cells may be accessed concurrently. In some cases, however, accessing multiple memory cells within one memory array at a time may be associated with an increased latency and power consumption of the memory device.

Techniques, systems, and devices are described herein for enabling the parallel access of multiple memory cells included in a memory device that has multiple tiers of memory cells. For example, the memory device may be configured to apply sequences of voltages to access circuitry such that multiple memory cells of a tier of memory cells may be concurrently accessed. For instance, the memory device may be configured to apply, during a first duration, a first voltage to a set of word lines coupled with a tier of memory cells, apply a second voltage to the set of word lines during a second duration after the first duration, and apply a third voltage to the set of word lines during a third duration after the second duration. The set of word lines may be coupled with a set of memory cells of the tier of memory cells, and the application of the first voltage, the second voltage, and the third voltage may enable concurrent programming of the set of memory cells based on respective sequences of voltages applied to corresponding bit lines during the first duration, the second duration, the third duration, or a combination thereof. For example, the memory device may be configured to activate a set of pillars coupled with the set of memory cells during the first, second, and third durations, which may enable voltages applied to the corresponding bit lines to be applied across the set of memory cells. Accordingly, the memory device may concurrently write multiple subsets of memory cells of the set of memory cells to desired logic states by applying various sequences of voltages to corresponding subsets of bit lines. For example, because a same voltage sequence is applied to each word line of the set of word lines, the logic state to which a memory cell is written may be based on a respective sequence of voltages applied to a corresponding bit line. The memory device may independently drive multiple bit lines and may thus independently and concurrently write logic states to each memory cell coupled with the set of word lines and the activated set of pillars.

By concurrently accessing multiple memory cells in accordance with techniques as described herein, a memory device may reduce latency and power consumption associated with performing access operations. For example, by concurrently accessing the multiple memory cells, the memory device may reduce an amount of time spent driving access circuitry (e.g., word lines, bit lines, etc.) in order to access the multiple memory cells, which may reduce a latency and power consumption associated with accessing the multiple memory cells.

Features of the disclosure are initially described in the context of memory devices and arrays with reference to FIGS. 1, 2, 3A, and 3B. Features of the disclosure are described in the context a system and a voltage diagram with reference to FIGS. 4 and 5. These and other features of the disclosure are further illustrated by and described with reference to an apparatus diagram and flowcharts that relate to techniques for parallel memory cell access as described with reference to FIGS. 6 and 7.

FIG. 1 illustrates an example of a memory device 100 that supports techniques for parallel memory cell access in accordance with examples as disclosed herein. In some examples, the memory device 100 may be referred to as a memory die, a memory chip, or an electronic memory apparatus. The memory device 100 may be operable to provide physical memory addresses/space that may be used or referenced by a system (e.g., a host device coupled with the memory array 100 or coupled with a memory device that includes one or more memory arrays or dies).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to undergo a phase change or change to different physical state during normal operation of the memory cell 105. For example, a phase change memory cell 105 may have an amorphous state (e.g., a relatively disordered atomic configuration) and a crystalline state (e.g., a relatively ordered atomic configuration).

In some examples, such as for thresholding memory cells 105 or self-selecting memory cells 105, some or all of the set of logic states supported by the memory cells 105 may be associated with an amorphous state of a chalcogenide material (e.g., the material in a single state may be operable to store different logic states). In some examples, the storage element of a memory cell 105 may be an example of a self-selecting storage element. In such examples, the material used in the memory cell 105 may be based on an alloy (such as the alloys listed above) and may be operated so as to undergo a change to a different physical state during normal operation of the memory cell 105. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state).

During a programming operation (e.g., a write operation) of a self-selecting memory cell 105, a polarity used for a write operation may influence (e.g., determine, set, program) a particular behavior or characteristic of the material of the memory cell 105, such as the threshold voltage of the material. The difference in threshold voltages of the material of the memory cell 105 depending on the logic state stored by the material of the memory cell 105 (e.g., the difference between the threshold voltage when the material is storing a logic state '0' versus a logic state '1') may correspond to the read window of the memory cell 105.

The memory array 100 may include access lines (e.g., row lines 115 each extending along an illustrative x-direction, column lines 125, each extending along an illustrative y-direction) arranged in a pattern, such as a grid-like pattern. Access lines may be formed of one or more conductive materials. In some examples, row lines 115, or some portion thereof, may be referred to as word lines. In some examples, column lines 125, or some portion thereof, may be referred to as digit lines or bit lines. References to access lines, row lines, column lines, word lines, digit lines, or bit lines, or their analogues, are interchangeable without loss of understanding or operation. Memory cells 105 may be positioned at intersections of access lines, such as row lines 115 and the column lines 125.

In some examples, memory cells 105 may be further arranged or addressed along an illustrative z-direction (e.g., in an implementation of memory cells 105 being located at different layers or levels along the illustrative z-direction, not shown), which may be supported by a different configuration of access lines, decoders, and other supporting circuitry. For example, the memory cells 105 may be arranged in tiers of memory cells 105 that are stacked along the illustrative z-direction.

Operations such as reading and writing may be performed on the memory cells 105 by activating or selecting access lines such as one or more of a row line 115 or a column line 125, among other access lines associated with alternative configurations. For example, by biasing a row line 115 and a column line 125 (e.g., applying a voltage to the row line 115 or the column line 125), a single memory cell 105 may be accessed at their intersection. The intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory array 100 may perform operations responsive to commands, which may be issued by a host device coupled with the memory device 100 or may be generated by the memory device 100 (e.g., by a local memory controller 145).

Accessing the memory cells 105 may be controlled through one or more decoders, such as a row decoder 110 or a column decoder 120. For example, a row decoder 110 may receive a row address from the local memory controller 150 and activate a row line 115 based on the received row address. A column decoder 125 may receive a column address from the local memory controller 160 and may activate a column line 125 based on the received column address.

The sense component 130 may be operable to detect a state (e.g., a material state, a resistance, a threshold state) of a memory cell 105 and determine a logic state of the memory cell 105 based on the stored state. The sense component 130 may include one or more sense amplifiers to amplify or otherwise convert a signal resulting from accessing the memory cell 105. The sense component 130 may compare a signal detected from the memory cell 105 to a reference 135 (e.g., a reference voltage). The detected logic state of the memory cell 105 may be provided as an output of the sense component 130 (e.g., to an input/output component 140), and may indicate the detected logic state to another component of the memory device 100 or a host device coupled with the memory device 100.

The local memory controller 150 may control the accessing of memory cells 105 through the various components (e.g., a row decoder 110, a column decoder 120, a sense component 130). In some examples, one or more of a row decoder 110, a column decoder 125, and a sense component 130 may be co-located with the local memory controller 150. The local memory controller 150 may be operable to receive one or more of commands or data from one or more different controllers (e.g., an external memory controller associated with a host device, another controller associated with the memory device 100), translate the commands or the data (or both) into information that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various voltages or currents used during the operation of the memory device 100. In general, the amplitude, the shape, or the duration of an applied voltage or current discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to various access commands (e.g., from a host device). The local memory controller 150 may be operable to perform other access operations not listed here or other operations related to the operating of the memory array 100 that are not directly related to accessing the memory cells 105.

The local memory controller 150 may be operable to concurrently access multiple memory cells 105 of the memory device 100. For example, the local memory controller 150 may be configured to drive (e.g., bias) row lines 115 of a first tier of memory cells 105 according to a first sequence of voltages including: a first voltage during a first duration, a second voltage during a second duration after the first duration, and a third voltage during a third duration after the second duration. During the first duration and based on the driving of the first voltage, a first subset of memory cells 105 of the first tier may threshold, where the thresholding of a memory cell 105 may be described with reference to FIGS. 2 through 4. During the second duration and based on the driving of the second voltage, a second subset of memory cells 105 of the first tier may threshold, and the first subset of memory cells 105 may be written to a first logic state concurrent with the thresholding of the second subset of memory cells 105. During the third duration and based on the driving of the third voltage, the second subset of memory cells 105 may be written to a second logic state. In this way, the local memory controller 150 may concurrently access multiple memory cells 105 of the first tier, which may reduce latency and power consumption associated with accessing the multiple memory cells 105.

The memory device 100 may include any quantity of non-transitory computer readable media that support techniques for parallel memory cell access. For example, a local memory controller 150, a row decoder 110, a column decoder 120, a sense component 130, or an input/output component 140, or any combination thereof may include or otherwise may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
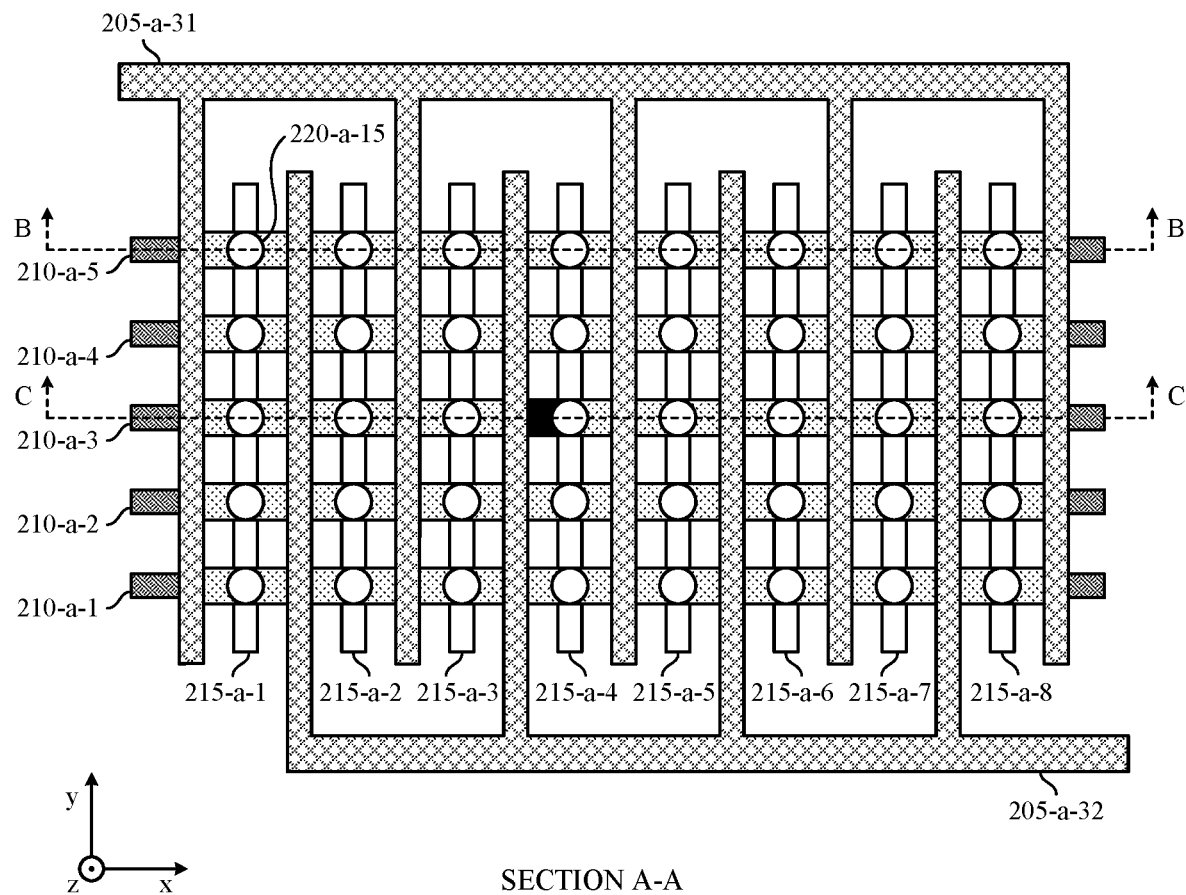
FIG. 2 illustrates a top view of an example of a memory array that supports techniques for parallel memory cell access in accordance with examples as disclosed herein.
Figure 3A:
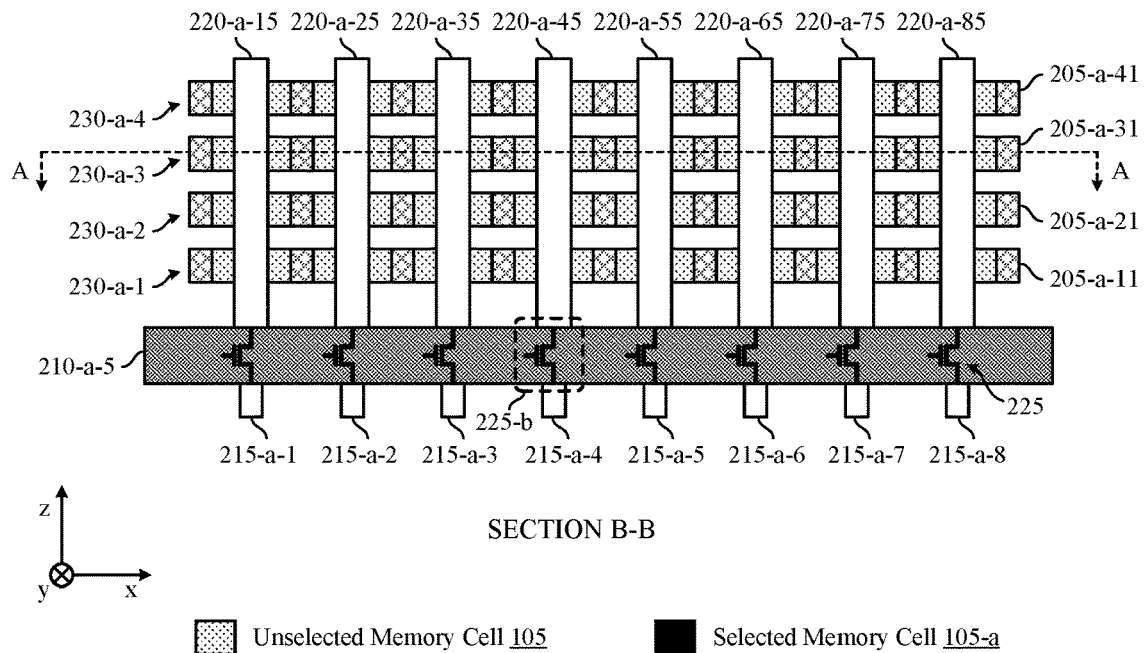
FIGS. 3A and 3B illustrate side views of an example of a memory array that supports techniques for parallel memory cell access in accordance with examples as disclosed herein.
Figure 3B:
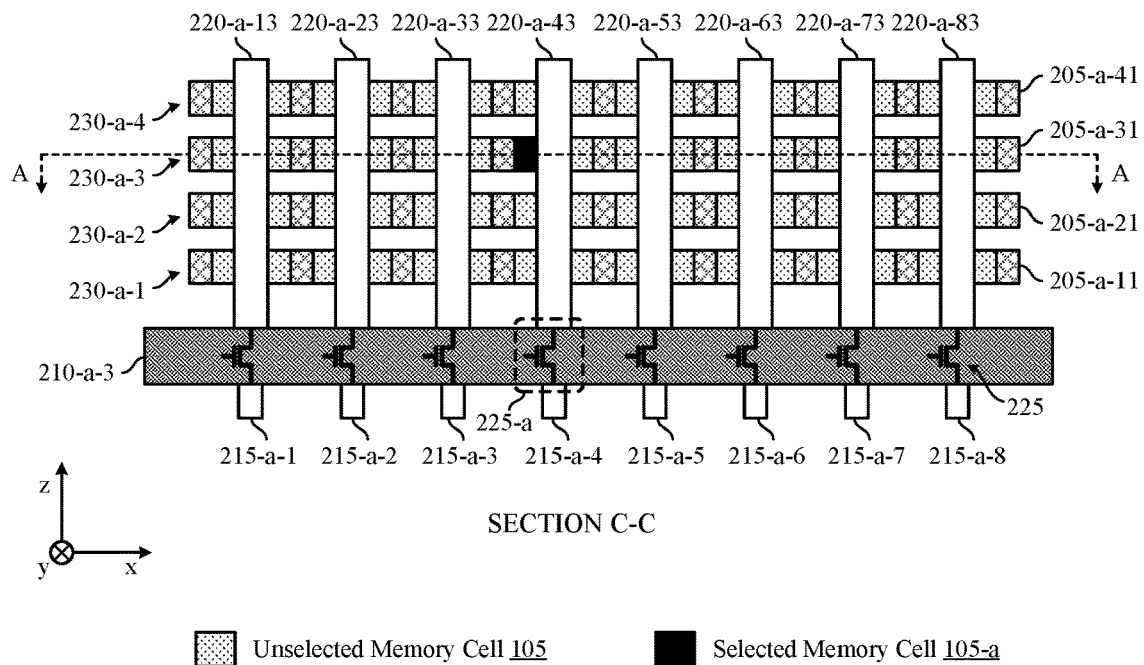

FIG. 2 illustrates a top view of an example of a memory array 200 that supports techniques for parallel memory cell access in accordance with examples as disclosed herein, and FIGS. 3A and 3B illustrate side views of the memory array 200. The memory array 200 may be included in a memory device 100 and illustrates an example of a three dimensional arrangement of memory cells 105 that may be accessed by various access lines. FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array with aspects removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, tiers, as illustrated in FIGS. 3A and 3B) and, in some examples, the z-direction may be orthogonal to a substrate (not shown) of the memory array 200. Although the illustrative example of memory array 200 includes four levels 230, a memory array 200 in accordance with examples as disclosed herein may include any quantity of one or more levels 230 (e.g., 64 levels, 128 levels). The word lines 205 may be arranged in a comb structure, with projections extending along the y-direction through alternating gaps between pillars 220 (e.g., with two word lines 205 per level n, according to odd word lines 205-a-n1 and even word lines 205-a-n2). Each memory cell 105 may be addressed or accessed according to an intersection between a word line 205 (e.g., a level selection, which may include an even/odd selection within a level 230) and a pillar 220 (e.g., a conductive pillar extending along the z-direction, which may be orthogonal to the x-direction, the y-direction, or both). For example, as illustrated, a selected memory cell 105-a of the level 230-a-3 may be located between or accessed according to an intersection between the pillar 220-a-43 and the word line 205-a-32.

The memory cells 105 each may include a chalcogenide material and, in some examples, may be or include thresholding memory cells or thresholding chalcogenide storage elements. A memory cell 105 may be read by applying a read bias across the memory cell 105, and a logic state of the memory cell 105 may be determined based on whether the memory cell 105 thresholds in the presence of an applied read bias. In the example of memory array 200, a memory cell 105 may be read with a voltage having a magnitude of 2*V (e.g., as a voltage or bias applied across the memory cell 105), and such a voltage may cause a memory cell 105 storing a first logic state (e.g., a logic 0) to threshold, and may not cause a memory cell 105 storing a second logic state (e.g., a logic 1) to threshold. In the example of memory array 200, a read bias may be applied by biasing a selected word line 205 with a positive voltage (e.g., +V) and by biasing a selected pillar 220 with a negative voltage (e.g., −V). Regarding the selected memory cell 105-a, a read bias, +V, may be applied to the word line 205-a-32, while other unselected word lines 205 may be grounded (e.g., biased to 0V). In some examples, a word line 205, or some portion thereof, may be an example of a row line 115 described with reference to FIG. 1, and selection or biasing of word lines 205 may be performed by or supported by a row decoder 110, among other configurations.

To apply a corresponding read bias to a pillar 220, the pillars 220 may be configured to be selectively coupled with a sense line 215 (e.g., a digit line, an access line extending along the y-direction) via a respective transistor 225 (e.g., a thin film transistor, a vertical transistor, a transistor having a channel or semiconductor junction along the z-direction). Accordingly, a selected pillar 220, or a combination of a selected pillar 220 and a selected sense line 215, may be an example of a selected column line 125 described with reference to FIG. 1 (e.g., a bit line). The transistors 225 may be activated by a pillar select line 210 (e.g., a gate line, a selection line, a pillar line, an access line extending along the x-direction, which may be orthogonal to the y-direction, the z-direction, or both) coupled with a gate of the transistors 225. In other words, each of the pillars 220 may have a first end (e.g., towards the negative z-direction, a bottom end) configured for coupling (e.g., to be selectively coupled with) a sense line 215 (e.g., an access line, a bit line). In some examples, the pillar select lines 210 and the transistors 225 may be considered to be components of a column decoder 125 (e.g., as pillar decoder components). The selection or biasing of pillars 220, sense lines 215, or pillar select lines 210, or various combinations thereof, may be performed by or supported by a column decoder 125, or a sense component 130, or both.

To apply the read bias, −V, to the pillar 220-a-43, the sense line 215-a-4 may be biased with the read bias, −V, and the pillar select line 210-a-3 may be grounded (e.g., biased to 0V) or biased to some other voltage that is relatively higher than the read bias, −V. In an example where the transistors 225 are n-type transistors, the pillar select line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated read voltage, −V. Other pillars 220 of the memory array 200 may be electrically floating when the transistor 225-a is activated. For example, the ground voltage being applied to the pillar select line 210-a-3 may not activate other transistors coupled with the pillar select line 210-a-3 because the ground voltage of the pillar select line 210-a-3 may not be greater than the voltage of the other sense lines 215 (e.g., which may be biased with a ground voltage or may be floating). Further, other unselected pillar select lines 210, including pillar select line 210-a-5 as shown in FIG. 3A, may be biased with the negative voltage (e.g., −V, or some other negative bias or bias relatively near or below the negative read voltage), such that none of the transistors 225 having gates coupled with an unselected pillar select line 210 are activated. Thus, the transistor 225-b coupled with the pillar select line 210-a-5 may be deactivated (e.g., operating in a non-conductive state), thereby isolating the negative voltage of the sense line 215-a-4 from the pillar 220-a-45, among other pillars 220.

The memory array 200 may support the parallel access of multiple memory cells 105. For example, a sequence of voltages (e.g., biases) may be applied to the word line 205-a-32 including: a first voltage during a first duration, a second voltage during a second duration after the first duration, and a third voltage during a third duration after the second duration. Over the course of the first duration, the second duration, and the third duration, multiple memory cells 105 coupled between the word line 205-a-32 and pillars 220 that are coupled with the pillar select line 210-a-3 may be concurrently written to various logic states (e.g., the memory cells 105 coupled between the word line 205-a-32 and the pillars 220-a-23, 220-a-43, 220-a-63, and 220-a-83). For example, the sense lines 215-a-2, 215-a-4, 215-a-6, and 215-a-8 may be independently and concurrently biased according to respective sequences of voltages over the course of the first duration, the second duration, and the third duration. The pillar select line 210-a-3 may be activated (e.g., grounded) during the first duration, the second duration, and the third duration, and thus the biasing of the sense lines 215-a-2, 215-a-4, 215-a-6, and 215-a-8 according to the respective sequences of voltages may apply various biases across the respective memory cells 105 based on the respective sequences of voltages. Each respective memory cell 105 may be written to a particular logic state (e.g., or have its logic state refreshed) based on a current logic state of the respective memory cell 105 and the respective biases applied across the respective memory cell 105 over the course of the first duration, the second duration, and the third duration. As such, logic states may be independently and concurrently written to each of the memory cells 105 coupled between the word line 205-a-32 and the pillars 220-a-23, 220-a-43, 220-a-63, and 220-a-83.

Figure 4:
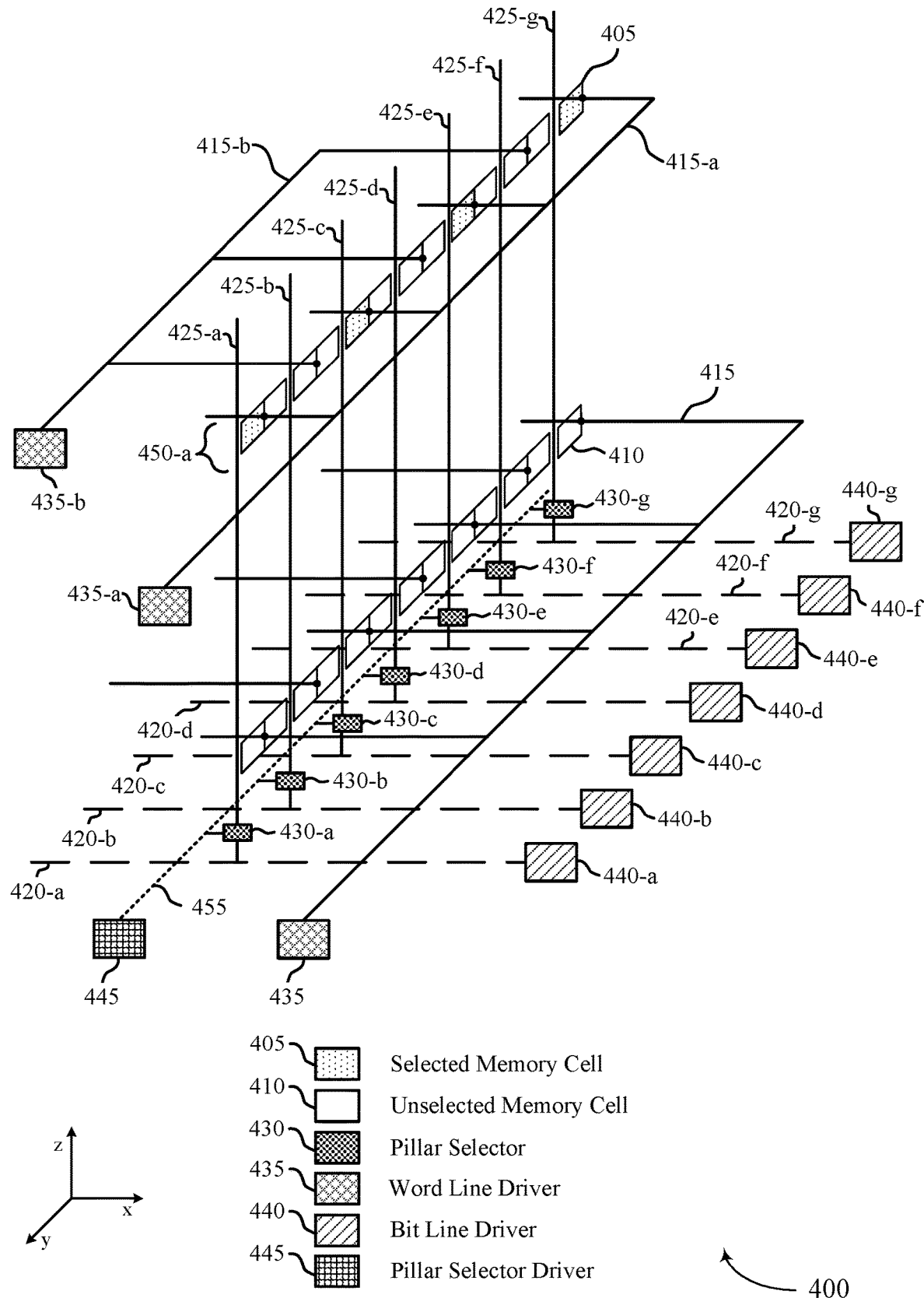
FIG. 4 illustrates an example of a system that supports techniques for parallel memory cell access in accordance with examples as disclosed herein.

FIG. 4 illustrates an example of a system 400 that supports techniques for parallel memory cell access in accordance with examples as disclosed herein. The system 400 may implement or be implemented by aspects of the memory device 100 or the memory array 200 described with reference to FIGS. 1, 2, 3A, and 3B. For example, in some cases, FIG. 4 may depict a three dimensional view of a system 400 that implements the memory array 200. The system 400 may be configured to enable the concurrent access of memory cells included in a tiered memory cell structure, which may provide improvements to latency and power consumption, among other benefits.

The system 400 may include multiple tiers of memory cells 450, which may be distributed along the z-direction (e.g., according to levels 230 described with reference to FIGS. 2, 3A, and 3B). For example, the system 400 may include tiers of memory cells that are vertically stacked. Each tier of memory cells 450 may include an array of memory cells that extends in the x-direction and the y-direction (e.g., may be a plane of memory cells). It is noted that, for illustrative purposes, FIG. 4 depicts a single row of thirteen memory cells included in each tier of memory cells 450 and the associated circuitry (e.g., word lines, pillar 425, etc.), however, each tier of memory cells 450 may include any quantity of memory cells and associated circuitry in the x-direction and the y-direction (e.g., where each row includes a quantity of memory cells and where additional rows are present along the x-direction for each tier).

The system 400 may include circuitry that enables the selecting and accessing of the memory cells included in each tier of memory cells 450. For example, each tier of memory cells 450 may be coupled with two sets of word lines 415, which may be examples of word lines 205 described with reference to FIGS. 2, 3A, and 3B. The two sets of word lines 415 at each tier of memory cells 450 may be arranged in an interleaved comb structure such that the two sets of word lines 415 may include alternating word lines that extend along the x-direction. For example, a tier of memory cells 450-a may be coupled with a set of word lines 415-a and a set of word lines 415-b, where the word lines of the set of word lines 415-a alternate with the word lines of the set of word lines 415-b in the y-direction (e.g., the word lines of the set of word lines 415-a are separated by the word lines of the set of word lines 415-b in the y-direction). In some examples, the set of word lines 415-a may be referred to as an even set of word lines 415 coupled with the tier of memory cells 450-a, and the set of word lines 415-b may be referred to as an odd set of word lines 415 coupled with the tier of memory cells 450-a, or vice versa.

A set of word lines 415 may be coupled with a word line driver 435. A word line driver 435 may be configured to bias the set of word lines 415 to various voltages in accordance with respective access operations. For example, the set of word lines 415-a may be coupled with a word line driver 435-a, and the set of word lines 415-b may be coupled with a word line driver 435-b. The word line driver 435-a may apply voltages to the set of word lines 415-a to access (e.g., select) memory cells coupled with the set of word lines 415-a, and the word lines driver 435-b may apply voltages to the set of word lines 415-b to access (e.g., select) memory cells coupled with the set of word lines 415-b. In some examples, the word line drivers 435 may be located below the tiers of memory cells 450 included in the system 400 (e.g., underneath the tiers of memory cells 450 in a complimentary metal-oxide-semiconductor (CMOS) under array (CuA) configuration).

The system 400 may additionally include bit lines 420, pillars 425, and pillar selectors 430 to support the selection and access of the memory cells included in each tier of memory cells 450. For example, each memory cell may be selected and accessed according to an intersection between a pillar 425 (e.g., a pillar 220 described with reference to FIGS. 2, 3A, and 3B) and a word line of a set of word lines 415. For instance, the system 400 may include a pillar 425-a, a pillar 425-b, a pillar 425-c, a pillar 425-d, a pillar 425-e, a pillar 425-f, and a pillar 425-g that extend vertically through the tiers of memory cells 450. Each pillar 425 may be coupled with two memory cells at each tier of memory cells 450, which may be individually and independently accessed based on which set of word lines 415 is driven. For example, activation of the pillars 425 and the set of word lines 415-a may select the memory cells 405 included in the tier of memory cells 450-a and coupled between the word lines of the set of word lines 415-a and the pillar 425-a, the pillar 425-c, the pillar 425-e, and the pillar 425-g, while other memory cells 410 may remain unselected.

Each pillar 425 may additionally be coupled with a pillar selector 430 (e.g., a transistor 225 described with reference to FIGS. 2, 3A, and 3B) that is configured to couple a respective pillar 425 to a respective bit line 420. For example, the system 400 may include a pillar selector 430-a coupled with the pillar 425-a and a bit line 420-a, a pillar selector 430-b coupled with the pillar 425-b and a bit line 420-b, a pillar selector 430-c coupled with the pillar 425-c and a bit line 420-c a pillar selector 430-d coupled with the pillar 425-d and a bit line 420-d, a pillar selector 430-e coupled with the pillar 425-e and a bit line 420-e, a pillar selector 430-f coupled with the pillar 425-f and a bit line 420-f, and a pillar selector 430-g coupled with the pillar 425-g and a bit line 420-g. The pillar selectors 430 may be coupled with a conductive line 455 (e.g., a pillar select line 210 described with reference to FIGS. 2, 3A, and 3B) that is configured to control activation of the pillars 425. For example, a pillar selector driver 445 may be coupled with the conductive line 455 and configured to bias the conductive line 455 to a voltage (e.g., a ground voltage) such that the pillar selectors 430 are activated and couple the pillars 425 to the bit lines 420 (e.g., sense lines 215 as described with reference to FIGS. 2, 3A, and 3B). In some examples, additional pillar selector drivers 445 (not shown) may be configured to bias other conductive lines 455 (not shown) to a different voltage to deactivate other pillar selectors 430 (not shown) such that a single row of pillars 425 (e.g., the pillars 425-a through 425-g) are selected at a time.

Additionally, the bit lines 420 may be coupled with bit line drivers 440 that are configured to bias the bits lines 420 to various voltages in accordance with respective access operations. For example, the bit line 420-a may be coupled with a bit line driver 440-a, the bit line 420-b may be coupled with a bit line driver 440-b, the bit line 420-c may be coupled with a bit line driver 440-c, the bit line 420-d may be coupled with a bit line driver 440-d, the bit line 420-e may be coupled with a bit line driver 440-e, the bit line 420-f may be coupled with a bit line driver 440-f, and the bit line 420-f may be coupled with a bit line driver 440-f. In some examples, the pillar selector driver 445, the bit line drivers 440, or both, may be located below the tiers of memory cells 450 included in the system 400 (e.g., underneath the tiers of memory cells 450 in a CuA configuration).

The system 400 may support programming the memory cells of the tiers of memory cells 450 to various logic states, such as a SET state, a RESET state, a logic '0', a logic '1', etc. For example, positive or negative voltages may be applied across a memory cell such that a SET state or a RESET state is written to the memory cell. In some examples, applying a voltage across the memory cell may set a threshold voltage state of the memory cell, such that the logic state may be determined based on whether the applied voltage exceeds a threshold voltage of the memory cell causing current to run through the memory cell. In some cases, this phenomenon may be described as a snapping event, a snap-back event, or a thresholding of the memory cell. In some cases, the applied voltage inducing a current through the memory cell may indicate that the memory cell stores a first logic state (e.g., a SET state), whereas the applied voltage failing to induce a current through the memory cell may indicate that the memory cell stores a second logic state (e.g., a RESET state), or vice versa.

The system 400 may support the parallel (e.g., concurrent, simultaneous) accessing of multiple selected memory cells 405 of a tier of memory cells 450. For example, the system 400 may support the concurrent and independent application of voltages across the selected memory cells 405 of the tier of memory cells 450-*a* such that the selected memory cells 405 may be independently and concurrently written to respective logic states (e.g., or have their logic states refreshed). To support such voltage application across the selected memory cells 405, the word line driver 435-*a* may be configured to apply a sequence of voltages (e.g., programming pulses) to the set of word lines 415-*a* (e.g., bias the set of word lines 415-*a* according to the sequence of voltages). For example, the word line driver 435-*a* may apply a first voltage to the set of word lines 415-*a* during a first duration, a second voltage to the set of word lines 415-*a* during a second duration after the first duration, and a third voltage to the set of word lines 415-*a* during a third duration after the second duration. Accordingly, each selected memory cell 405 may have a same sequence of voltages applied to a word line terminal of the selected memory cell 405 over the course of the first duration, the second duration, and the third duration.

A logic state written to a selected memory cell 405 may be based on a biasing of a respective bit line 420 over the course of the first duration, the second duration, and the third duration. For example, the pillar selector driver 445 may apply a voltage to the conductive line 455 during the first duration, the second duration, and the third duration, such that the pillars 425-*a* through 425-*g* are coupled with the bit lines 420-*a* through 420-*g* during the first duration, the second duration, and the third duration. As a result, voltage biases of the pillars 425 during the first duration, the second duration, and the third duration may correspond to (e.g., be the same as) voltage biases of respective bit lines 420 during the first duration, the second duration, and the third duration. Accordingly, voltages applied across a selected memory cell 405 (e.g., a voltage difference between a voltage at the word line terminal a pillar terminal of the selected memory cell 405) during the first duration, the second duration, and the third duration may be based on a sequence of voltages applied to a corresponding bit line 420 by a corresponding bit line driver 440 during the first duration, the second duration, and the third duration. The voltages applied across the selected memory cell 405 during the first duration, the second duration, and the third duration may determine the logic state that is written to the selected memory cell 405. Because each bit line 420 may be independently driven by a corresponding bit line driver 440 during the first duration, the second duration, and the third duration, each selected memory cell 405 may be independently and concurrently written to a desired logic state during the first duration, the second duration, the third duration, or a combination thereof.

The sequence of voltages applied to a bit line 420 by a bit line driver 440 during the first duration, the second duration, the third duration, or a combination thereof, may be based on a current logic state of a selected memory cell 405 and a desired logic state of the selected memory cell 405 to which the selected memory cell 405 is to be written. For example, as described with reference to FIG. 5 below, the first voltage applied to the set of word lines 415-*a* may function as a pre-read pulse or a drift cancellation pulse, and the second voltage applied to the set of word lines 415-*a* and the third voltage applied to the set of word lines 415-*a* may function as a SET pulse (e.g., a voltage pulse that may write a SET state to a selected memory cell 405) and a RESET pulse (e.g., a voltage pulse that may write a RESET state to a selected memory cell 405), respectively, or vice versa. Thus, the sequence of voltages applied to the bit line 420 may be applied such that the correct pulses may be across the selected memory cell 405 to write the selected memory cell 405 to the desired logic state. For example, to write a selected memory cell 405 having a current logic state of SET to a desired logic state of RESET, a bit line driver 440 may apply a sequence of voltages to a corresponding bit line 420 such that at least the RESET pulse is applied across the selected memory cell 405 (e.g., during the third duration). Additional details related to writing logic states to selected memory cells 405 are described with reference to FIG. 5 below. For example, various write algorithms that support various logic state transitions or logic state refreshing, such as a SET-to-SET transition, a SET-to-RESET transition, a RESET-to-SET transition, or a RESET-to-RESET transition, are described with reference to FIG. 5 below.

In some examples, the system 400 may include multiple sense amplifiers (not shown) to support the parallel access of the selected memory cells 405. For example, the system 400 may include a sense amplifier for each bit line 420, every other bit line 420, every third bit line 420, or some other quantity of sense amplifiers, such that multiple access operations may be concurrently performed on the selected memory cells 405 in accordance with the techniques described herein.

Over the course of the first duration, the second duration, and the third duration, multiple selected memory cells 405 may concurrently threshold, be written to respective logic states, or a combination thereof. For example, during the first duration, a first subset of the selected memory cells 405 may threshold in response to applying the first voltage (e.g., and a voltage to corresponding bit lines 420 such that the first voltage is applied across the first subset). In some examples, multiple memory cells of the first subset may concurrently threshold during the first duration (e.g., simultaneously threshold, threshold during overlapping portions of the first duration).

During the second duration, a second subset of the selected memory cells 405 may threshold in response to applying the second voltage (e.g., and a voltage to corresponding bit lines 420 such that the second voltage is applied across the second subset). Additionally, at least one memory cell of the first subset may be written to a first logic state (e.g., a SET state) during the second duration in response to applying the second voltage (e.g., and a voltage to corresponding bit lines 420 such that the second voltage is applied across the first subset). For example, the application of the first voltage may cause the memory cells of the first subset to threshold, while the application of the second voltage may cause the at least one memory cell of the first subset to be written to the first logic state. In some examples, multiple memory cells of the second subset may concurrently threshold during the second duration (e.g., simultaneously threshold, threshold during overlapping portions of the second duration). In some examples, multiple memory cells of the first subset may be concurrently written to the first logic state (e.g., simultaneously written, written during overlapping portions of the second duration). In some examples, one or more memory cells of the second subset may threshold concurrently with one or more memory cells of the first subset being written to the first logic state (e.g., simultaneously thresholded and written, thresholded and written during overlapping portions of the second duration).

During the third duration, at least one memory cell of the second subset may be written to a second logic state (e.g., a RESET state) in response to applying the third voltage (e.g., and a voltage to corresponding bit lines 420 such that the third voltage is applied across the second subset). For example, the application of the second voltage may cause the memory cells of the second subset to threshold, while the application of third voltage may cause the at least one memory cell of the second subset to be written to the second logic state. In some examples, multiple memory cells of the second subset may be concurrently written during the third duration (e.g., simultaneously written, written during overlapping portions of the third duration).

In some examples, when a state transition (e.g., or thresholding event) for a memory cell occurs, the memory cell may draw a current from a corresponding word line, bit line, or both, which may cause a voltage potential between the word line and the bit line to drop. In some examples, a strength of a word line driver (e.g., the word line driver 435-a) and a relatively large capacitance associated with a set of word lines 415 (e.g., the set of word lines 415-a) may cause the voltage drop of the word line in response to the state transition to be relatively small or insubstantial. As a result, the voltages applied to the set of word lines 415-a and bit lines 240 during the first duration, the second duration, and the third duration may be maintained (e.g., remain relatively constant) over the course of the respective durations even when memory cells threshold or are written to logic states during the durations. This voltage maintenance may enable multiple memory cells (e.g., of the first subset, of the second subset, of the third subset) to concurrently threshold, be written to logic states, or a combination thereof, without dropping the voltage of the set of word lines 415-a such that a selected memory cell 405 may be unable to threshold or be written to a logic state.

In some examples, a word line driver 435 may support a maximum number of memory cells that may concurrently transition logic states at a time (e.g., without dropping a voltage of a corresponding set of word lines 415 such that selected memory cells 405 are unable to transition or threshold). A given codeword may be programmed such that a number of memory cells that will transition logic states based on the codeword and a number of memory cells that will not transition logic states based on the codeword may be predicted. As a result, a codeword may be programmed such that concurrent programming of each memory cell that may threshold during each of the durations is supported. Additionally, a given pulse duration(s) (e.g., a duration of the first duration, the second duration, the third duration) associated with the codeword may be configured to provide enough of a time window for all memory cells programmed to transition logic states are able to transition within the pulse duration. In some cases, the pulse duration may be less than a time for sequential transition of all memory cells programmed to transition logic states.

In some examples, the set of word lines 415-b may be undriven by the word line driver 435-b during the first duration, the second duration, and the third duration. As a result, the memory cells of the tier of memory cells 450-a coupled with the set of word lines 415-b may be unselected memory cells 410 during the first duration, the second duration, and the third duration. In some examples, the bit line 420-b, the bit line 420-d, and the bit line 420-f may be undriven during the first duration, the second duration, and the third duration. As a result, the memory cells of the tier of memory cells 450-a coupled between the set of word lines 415-a and the pillars 425-b, 425-d, and 425-f may be unselected memory cells 410 during the first duration, the second duration, and the third duration.

In some examples, all memory cells of a given row of memory cells of a given tier of memory cells 450 (e.g., all the memory cells shown of the tier of memory cells 450-a) may be accessed with four cycles of the three duration concurrent memory cell access operation described herein. For example, the selected memory cells 405 may be accessed and programmed during a first cycle of applying a sequence of voltages to a set of word lines 415 (e.g., the set of word lines 415-a) and respective voltage sequences to corresponding bit lines 420 over the course of the first duration, the second duration, and the third duration, while remaining memory cells of the given row may remain unselected during the first cycle. During a second cycle, for example, the set of word lines 415-a may be driven along with the bit lines 420-b, 420-d, and 420-f, while the set of word lines 415-b and the bit lines 420-a, 420-c, 420-e, and 420-g may be undriven. Accordingly, during the second cycle, the memory cells of the tier of memory cells 450-a coupled between the set of word lines 415-a and the pillars 425-b, 425-d, and 425-f may be the selected memory cells 405, while the remaining memory cells of the row may be unselected. Similarly, a first subset of memory cells coupled with the set of word lines 415-b may be selected and accessed during a third cycle, and a second subset of memory cells (corresponding to the unselected memory cells coupled with the set of word lines 415-b during the third cycle) may be selected and accessed during fourth cycle. Accordingly, each memory cell of a given row of memory cells of a given tier of memory cells 450 may be accessed using four cycles of parallel memory cell access.

Figure 5:
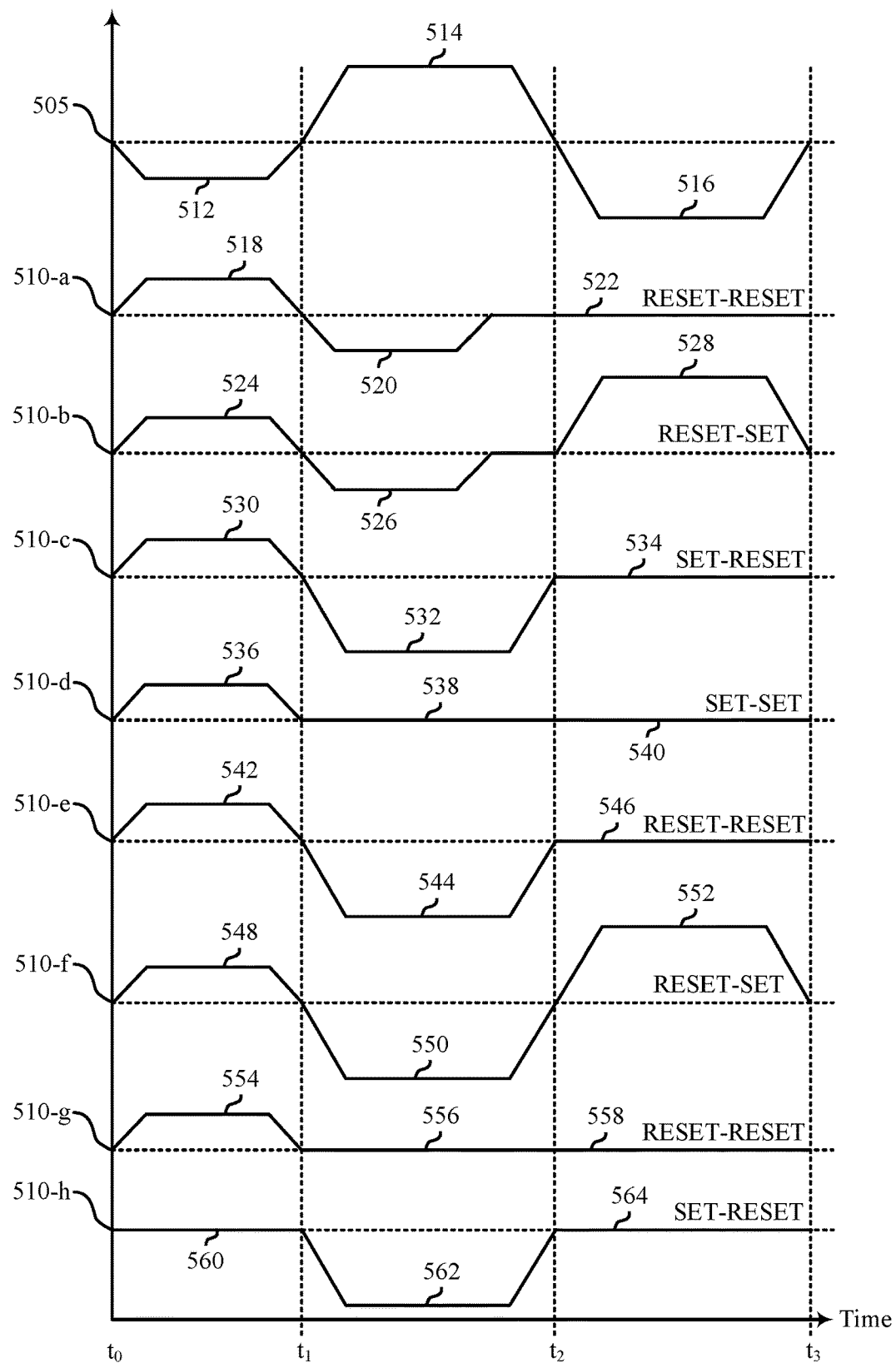
FIG. 5 illustrates an example of a voltage diagram that supports techniques for parallel memory cell access in accordance with examples as disclosed herein.

FIG. 5 illustrates an example of a voltage diagram 500 that supports techniques for parallel memory cell access in accordance with examples as disclosed herein. The voltage diagram 500 may illustrate aspects of concurrent memory cell access operations performed on the selected memory cells 405 as described with reference to FIG. 4. For example, the voltage diagram 500 depicts a word line voltage sequence 505 that may represent a sequence of voltages applied to the set of word lines 415-a during a first duration, a second duration, and a third duration. The voltage diagram 500 additionally depicts various bit line voltage sequences 510, which may represent examples of sequences of voltages that may be applied to a bit line 420 during the first duration, the second duration, the third duration, or a combination thereof. The operations associated with the voltage diagram 500 may enable concurrent selection and access of memory cells included in a tier of memory cells, which may reduce latency and power consumption of a memory device, among other benefits.

As illustrated in FIG. 5, the word line voltage sequence 505 and the bit line voltage sequences 510 may include voltage pulses that are applied to word lines (e.g., the set of word lines 415-a) and bit lines (e.g., a bit line 420), respectively, during respective durations. For example, a first duration may correspond to a time from $t_0$ to $t_1$, a second duration may correspond to a time from $t_1$ to $t_2$, and a third duration may correspond to a time from $t_2$ to $t_3$. In some examples, the first duration may be shorter than the second duration and the third duration. In some examples, the second duration and the third duration may have a same value (e.g., a time difference between $t_1$ and $t_2$ may be the same as a time difference between $t_2$ and $t_3$).

The word line voltage sequence 505 may include a pulse 512, a pulse 514, and a pulse 516. Each of the pulse 512, the pulse 514, and the pulse 516 may correspond to voltages that may be applied to a set of word lines (e.g., the set of word lines 415-a) during the first duration, the second duration, and the third duration, respectively. For example, a word line driver (e.g., a word line driver 435) may bias the set of word lines to a first voltage during the first duration according to the pulse 512, a second voltage during the second duration according to the pulse 514, and a third voltage during the third duration according to the pulse 516. In some examples, the pulse 512 and the pulse 516 may have a first polarity, and the pulse 514 may have a second polarity different from the first polarity. It is noted that, for illustrative purposes, FIG. 5 depicts the first polarity as being a negative polarity and the second polarity as being a positive polarity, however, the techniques described herein may be adapted and applied such that the first polarity is positive and the second polarity is negative.

The pulse 512 may have a first magnitude, the pulse 514 may have a second magnitude, and the pulse 516 may have a third magnitude. In some examples, the first magnitude is less than the second magnitude, the third magnitude, or both. In some examples, the second magnitude and the third magnitude are a same magnitude (e.g., as depicted in the example of FIG. 5). In some examples, the second magnitude and the third magnitude may be different magnitudes (e.g., the second magnitude is greater than the third magnitude, or vice versa).

In some examples, the pulse 512 may act as a drift cancellation pulse, a pre-read pulse, or both. For example, the pulse 512 may function as a pre-read pulse to determine a current logic state of a selected memory cell. For instance, a selected memory cell having a current SET logic state may threshold in response to the application of the pulse 512 and a corresponding opposite polarity pulse applied to a corresponding bit line (e.g., pulse 518, pulse 524, etc.), while a selected memory cell having a current RESET logic state may not threshold in response to the application of the pulse 512 and the corresponding opposite polarity pulse (e.g., or vice versa, for example, if the pulse 512 had a positive polarity). Accordingly, a memory device may determine a current logic state of a selected memory cell based on whether the selected memory cell thresholds in response to the application of the pulse 512.

Additionally or alternatively, the pulse 512 may function as a drift cancellation pulse to cancel a drift that has occurred in a memory cell. For example, in some cases, the threshold voltage of a memory cell may drift (e.g., increase or decrease) over time. For instance, electrical characteristics of a memory cell (e.g., resistivity of the memory cell) may change after repeated access operations are performed on the memory cell resulting in a drift in threshold voltage. In some cases, a memory device may be configured to "cancel" drift that has occurred in the memory cell. That is, the memory device may be configured to lower the threshold voltage of the memory cell having experienced drift. As an example, if a memory cell was previously programmed to a SET logic state, it may have drifted over time and thus it may be difficult to program the memory cell to the RESET logic state. Applying the pulse 512 may cancel the drift that occurred so that programming a RESET logic state to the memory cell will be successful. To cancel the drift of a memory cell (e.g., to lower its threshold voltage), the memory device may apply a voltage to the memory cell that corresponds to a logic state that was written to the memory cell during a prior access operation. For example, if a SET logic state was written during a prior access operation (e.g., using a positive programming voltage), then a negative voltage (e.g., pulse 512) may be applied to the memory cell to cancel or mitigate any drift that may have occurred. In some examples, the word line voltage sequence 505 may exclude the pulse 512. Here, a drift cancellation operation or a pre-read operation may not be performed.

In some examples, the pulse 514 may act as a RESET pulse, and the pulse 516 may act as a SET pulse, or vice versa. That is, the pulse 514 may be used to write a selected memory cell to the RESET logic state, and the pulse 516 may be used to write a selected memory cell to the SET logic state.

The word line voltage sequence 505 may support multiple different logic state transitions of selected memory cells (e.g., selected memory cells 405). For example, the word line voltage sequence 505 may support a RESET-RESET logic state transition, a RESET-SET logic state transition, a SET-RESET logic state transition, and a SET-SET logic state transition. In some examples, the SET-SET logic state transition may correspond to a selected memory cell having a current SET logic state refreshed, and the RESET-RESET logic state transition may correspond to a selected memory cell having a current RESET logic state refreshed.

The logic state transition that occurs for a given selected memory cell may be based on a bit line voltage sequence 510 applied to a corresponding bit line and a current logic state of the selected memory cell. For example, the word line voltage sequence 505 may be a common voltage sequence that is applied to each selected memory cell, for instance, based on the set of word lines sharing a common word line driver. Accordingly, the voltages applied across the selected memory cell over the course of the first duration, the second duration, and the third duration, and therefore the logic state that is written to the selected memory cell, may be based on the bit line voltage sequence 510 applied to the corresponding bit line.

For example, the voltage diagram 500 depicts a bit line voltage sequence 510-a that includes a pulse 518, a pulse 520, and a pulse 522. The bit line voltage sequence 510-a may be used to cause a RESET-RESET logic state transition. That is, the bit line voltage sequence 510-a may be applied to a bit line to refresh a RESET logic state of a selected memory cell. For example, in accordance with the bit line voltage sequence 510-a, a bit line driver may bias the bit line according to the pulse 518 during the first duration, according to the pulse 520 during the second duration, and according to the pulse 522 during the third duration. Biasing the bit line according to the pulse 518 may cause a voltage corresponding to a difference between the pulse 512 and the pulse 518 to be applied across the selected memory cell during the first duration. The selected memory cell may not threshold in response to the application of the pulse 512 and the pulse 518 based on storing the RESET logic state. The pulse 520 may be used to refresh the RESET logic state of the selected memory cell and to cancel or mitigate previous drift or drift that may be caused by the pulse 512 and the pulse 518. For example, in the example of FIG. 5, the RESET logic state may be written by applying a positive voltage bias across a selected memory cell. Accordingly, the pulse 520 may function as a drift cancellation pulse by applying a positive voltage bias across the selected memory cell having the RESET logic state, thereby cancelling or mitigating previous drift of the selected memory cell or drift caused by the positive voltage bias applied across the selected memory cell during the first duration. In some examples, the pulse 520 may be referred to as an embedded drift cancellation pulse, for example, due to being embedded within the duration of the RESET pulse. In some examples, the pulse 518 and the pulse 520 may have the first magnitude. In some examples, the pulse 520 may have a magnitude that is less than the second magnitude. The pulse 518 may have the second polarity and the pulse 520 may have the first polarity.

After the pulse 520, the bit line may be driven to a default voltage based on the desired RESET logic state being refreshed and stored by the selected memory cell. For example, the pulse 522 may correspond to the bit line being biased to a ground voltage.

A bit line voltage sequence 510-b may be used to cause a RESET-SET logic state transition. For example, the bit line voltage sequence 510-b may include a pulse 524 over the first duration, a pulse 526 over the second duration, and a pulse 528 over the third duration. In some examples, the pulse 524 and the pulse 526 may correspond to (e.g., be the same as) the pulse 518 and the pulse 520, respectively. That is, the pulse 524 may act as a pre-read pulse, and a selected memory cell may not threshold in response to the application of the pulse 512 and the pulse 524 based on storing the RESET logic state. The pulse 526 may act as a drift cancellation pulse (e.g., an embedded drift cancellation pulse). Here, because the desired logic state is the SET logic state, the pulse 526 may facilitate the programming of the selected memory cell to the SET logic state via the pulse 528 by cancelling previous drift or drift that may be caused by the pulse 512 and the pulse 524. The pulse 528 may have the third magnitude and the second polarity. Accordingly, biasing the bit line according to the pulse 528 may cause a positive voltage corresponding to a difference between the pulse 516 (e.g., the SET pulse) and the pulse 528 to be applied across the selected memory cell during the third duration, thereby writing the selected memory cell to the SET logic state.

A bit line voltage sequence 510-c may be used to cause a SET-RESET logic state transition. For example, the bit line voltage sequence 510-c may include a pulse 530 over the first duration, a pulse 532 over the second duration, and a pulse 534 over the third duration. The pulse 530 may act as a pre-read and drift cancellation pulse. For example, in response to applying the pulse 512 and the pulse 530 during the first duration, a selected memory cell may threshold based at least in part on storing the SET logic state. Because the desired logic state is the RESET logic state and the pulse 514 corresponds to the RESET pulse, a bit line driver may apply the pulse 532 (e.g., having the second magnitude and the first polarity) to the bit line during the second duration to cause a positive voltage corresponding to a difference between the pulse 514 and the pulse 532 to be applied across the selected memory cell during the second duration, thereby writing the selected memory cell to the RESET logic state. After the pulse 532, the bit line may be driven to a default voltage based on the desired RESET logic state being stored by the selected memory cell. For example, the pulse 534 may correspond to the bit line being biased to a ground voltage.

A bit line voltage sequence 510-d may be used to cause a SET-SET logic state transition. That is, the bit line voltage sequence 510-d may be applied to a bit line to refresh a SET logic state of a selected memory cell. For example, the bit line voltage sequence 510-d may include a pulse 536 over the first duration, a pulse 538 over the second duration, and a pulse 540 over the third duration. The pulse 536 may act as a pre-read and drift cancellation pulse. For example, in response to applying the pulse 512 and the pulse 536 during the first duration, a selected memory cell may threshold based at least in part on storing the SET logic state. Such thresholding may indicate that the selected memory cell is already in the desired SET logic state. Accordingly, the bit line may be driven to a default voltage during the second duration and the third duration (e.g., the pulse 538 and the pulse 540 may correspond to the bit line being biased to a ground voltage). Additionally, the pulse 536 may act as a drift cancellation pulse by causing a negative voltage bias to be applied across the selected memory cell during the first duration, thereby refreshing the SET logic state and cancelling any previous drift of the selected memory cell.

Different bit line voltage sequences 510 may be used to support a same logic state transition according to various write techniques. For example, some bit line voltage sequences 510 may correspond to "normal" write techniques that includes one or more drift cancellation pulses, a pre-read pulse, or both. In some examples, the inclusion of drift cancellation pulses may refresh a logic state of a memory cell or transition the logic state of a memory cell while cancelling associated drift. In some examples, exclusion of drift cancellation pulses may reduce power consumption (e.g., and latency) associated with programming a memory cell, however, associated drift may remain. For example, a "force" write technique may exclude any drift cancellation pulses or pre-read pulses from the voltage sequences. In some examples, bit line voltage sequences 510-a through 510-g may be examples of "normal" write techniques, while a bit line voltage sequence 510-h may be an example of a "force" write technique. In some examples, the bit line voltage sequences 510-a and 510-b may implement embedded cancellation pulses, which may increase power consumption efficiency while still cancelling drift as compared to the bit line voltage sequences 510-e through 510-g as described in further detail below.

A bit line voltage sequence 510-e may be used to cause a RESET-RESET logic state transition. That is, the bit line voltage sequence 510-e may be applied to a bit line to refresh a RESET logic state of a selected memory cell. For example, the bit line voltage sequence 510-e may include a pulse 542 over the first duration, a pulse 544 over the second duration, and a pulse 546 over the third duration. The pulse 542 may act as a pre-read pulse. For example, in response to applying the pulse 512 and the pulse 542 during the first duration, a selected memory cell may fail to threshold based at least in part on storing the RESET logic state. The pulse 544 may act as a drift cancellation pulse to refresh the RESET logic state of the selected memory cell. For example, the pulse 544 may have the second magnitude and the first polarity, thereby causing a positive voltage bias across the selected memory cell during the second duration. After the pulse 544, the bit line may be driven to a default voltage based on the desired RESET logic state being refreshed and stored by the selected memory cell. For example, the pulse 546 may correspond to the bit line being biased to a ground voltage.

Accordingly, both the bit line voltage sequence 510-*a* and the bit line voltage sequence 510-*e* may cause a RESET-RESET logic state transition. In some cases, however, the bit line voltage sequence 510-*a* may be associated with a lower power consumption than the bit line voltage sequence 510-*e* based on a magnitude and duration of the pulse 520 being less than a magnitude and duration of the pulse 544.

A bit line voltage sequence 510-*f* may be used to cause a RESET-SET logic state transition. For example, the bit line voltage sequence 510-*f* may include a pulse 548 over the first duration, a pulse 550 over the second duration, and a pulse 552 over the third duration. The pulse 548 may act as a pre-read pulse. For example, in response to applying the pulse 512 and the pulse 548 during the first duration, a selected memory cell may fail to threshold based at least in part on storing the RESET logic state. The pulse 550 may act as a drift cancellation pulse, for example, based on having the second magnitude and the first polarity and may facilitate the programming of the selected memory cell to the SET logic state via the pulse 552 (e.g., by cancelling previous drift or drift that may be caused by the pulse 512 and the pulse 548). The pulse 552 may have the third magnitude and the second polarity. Accordingly, biasing the bit line according to the pulse 552 may cause a positive voltage corresponding to a difference between the pulse 516 (e.g., the SET pulse) and the pulse 552 to be applied across the selected memory cell during the third duration, thereby writing the selected memory cell to the SET logic state.

Accordingly, both the bit line voltage sequence 510-*b* and the bit line voltage sequence 510-*f* may cause a RESET-SET logic state transition. In some cases, however, the bit line voltage sequence 510-*b* may be associated with a lower power consumption than the bit line voltage sequence 510-*f* based on a magnitude and duration of the pulse 526 being less than a magnitude and duration of the pulse 550.

A bit line voltage sequence 510-*g* may be used to cause a RESET-RESET logic state transition. For example, the bit line voltage sequence 510-*f* may include a pulse 554 over the first duration, a pulse 556 over the second duration, and a pulse 558 over the third duration. The pulse 554 may act as a pre-read pulse. For example, in response to applying the pulse 512 and the pulse 554 during the first duration, a selected memory cell may fail to threshold based at least in part on storing the RESET logic state. Here, the selected memory cell may be determined to be in the desired RESET logic state based on applying the pulse 554 and the bit line may be driven to a default voltage during the second duration and the third duration. For example, the pulse 556 and the pulse 558 may correspond to the bit line being biased to a ground voltage.

Accordingly, both the bit line voltage sequence 510-*a* and the bit line voltage sequence 510-*g* may cause a RESET-RESET logic state transition. In some cases, however, the RESET logic state of the selected memory cell may not be refreshed as a result of the bit line voltage sequence 510-*g* based on excluding the application of a drift cancellation pulse during the second duration. Thus, drift of the selected memory cell may still be present after the bit line voltage sequence 510-*g*, but power consumption may be reduced compared to the bit line voltage sequence 510-*a* based on the bit line being driven to the default voltage after the pulse 554.

A bit line voltage sequence 510-*h* may be used to cause a SET-RESET logic state transition. For example, the bit line voltage sequence 510-*h* may include a pulse 560 over the first duration, a pulse 562 over the second duration, and a pulse 564 over the third duration. The pulse 560 may correspond to the bit line being driven to a default voltage (e.g., biased to a ground voltage), and thus the bit line voltage sequence 510-*h* may exclude a pre-read pulse or a drift cancellation pulse during the first duration. Because the desired logic state is the RESET logic state and the pulse 514 corresponds to the RESET pulse, a bit line driver may apply the pulse 562 (e.g., having the second magnitude and the first polarity) to the bit line during the second duration to cause a negative voltage corresponding to a difference between the pulse 514 and the pulse 562 to be applied across a selected memory cell during the second duration. As a result, the selected memory cell may be written to the RESET logic state. After the pulse 562, the bit line may be driven to the default voltage based on the desired RESET logic state being stored by the selected memory cell. For example, the pulse 564 may correspond to the bit line being biased to the ground voltage.

Accordingly, both the bit line voltage sequence 510-*c* and the bit line voltage sequence 510-*h* may cause a SET-RESET logic state transition. In some cases, however, the exclusion of a drift cancellation pulse from the bit line voltage sequence 510-*h* may result in the presence of drift in the RESET logic state of the selected memory cell. In some cases, power consumption may be reduced compared to the bit line voltage sequence 510-*h* based on the bit line being driven to the default voltage during the first duration.

In some examples, the write line voltage sequence 505 and the bit line voltage sequences 510 may include respective pulses of opposite polarities than those depicted in the example of FIG. 5. Here, the logic states written, the logic states refreshed, the drift cancellation that occurs, and the thresholding of selected memory cells may be reversed based on opposite polarities being applied across selected memory cells.

In some examples, multiple bit line voltage sequences 510 may be concurrently applied to multiple selected memory cells. For example, one or more of a first subset of selected memory cells may be biased according to the bit line voltage sequence 510-*a*, a second subset of selected memory cells may be concurrently biased according to the bit line voltage sequence 510-*b*, a third subset of selected memory cells may be concurrently biased according to the bit line voltage sequence 510-*c*, and so on. In some examples, multiple selected memory cells may be concurrently biased according to a same bit line voltage sequence 510 (e.g., the bit line voltage sequence 510-*a*). In this way, any quantity of selected memory cells may be concurrently and independently accessed according to the word line voltage sequence 505 and respective bit line voltage sequences 510, thereby reducing latency and power consumption associated with accessing the selected memory cells.

Figure 6:
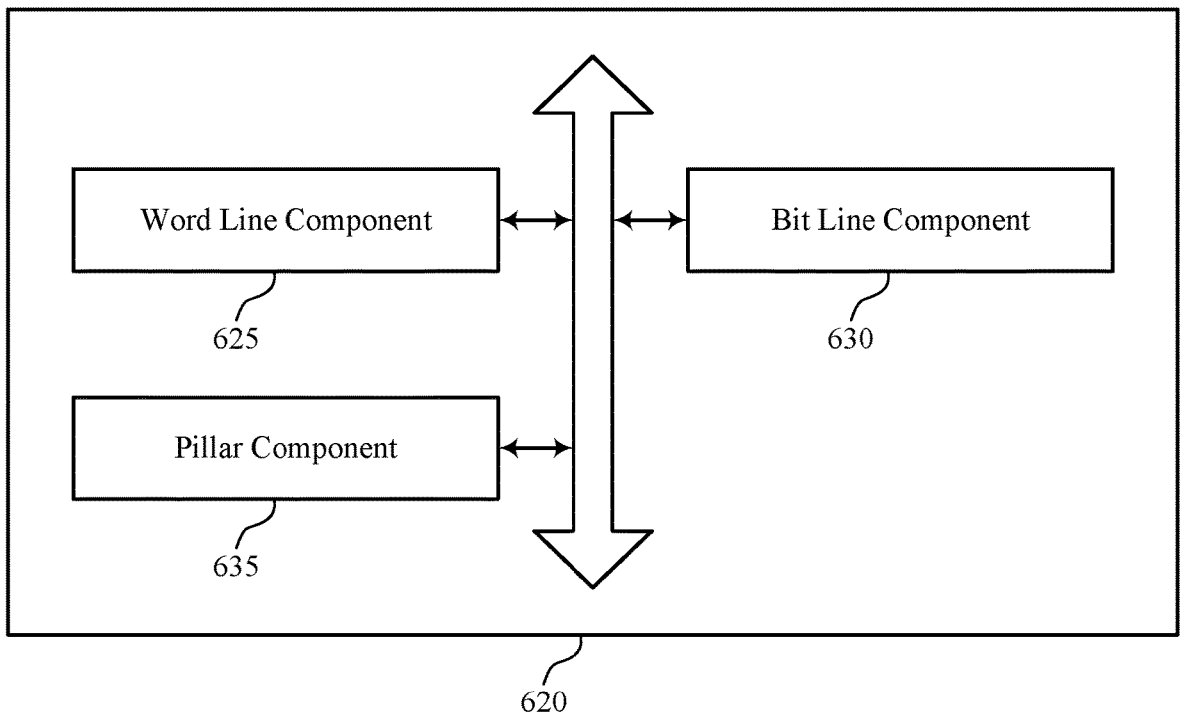
FIG. 6 shows a block diagram of a memory device that supports techniques for parallel memory cell access in accordance with examples as disclosed herein.

FIG. 6 shows a block diagram 600 of a memory device 620 that supports techniques for parallel memory cell access in accordance with examples as disclosed herein. The memory device 620 may be an example of aspects of a memory device as described with reference to FIGS. 1 through 5. The memory device 620, or various components thereof, may be an example of means for performing various aspects of techniques for parallel memory cell access as described herein. For example, the memory device 620 may include a word line component 625, a bit line component 630, a pillar component 635, or any combination thereof. Each of these components may communicate, directly or indirectly, with one another (e.g., via one or more buses).

The word line component 625 may be configured as or otherwise support a means for applying, during a first duration, a first voltage to a first set of word lines coupled with a first tier of memory cells of a plurality of tiers of memory cells, where each tier of the plurality of tiers is coupled with two sets of alternating word lines and a plurality of pillars extend vertically through the plurality of tiers, each pillar of the plurality of pillars coupled with a respective bit line and two memory cells at each tier of the plurality of tiers, and where, during the first duration, at least one memory cell of a first subset of the first tier of memory cells thresholds based at least in part on applying the first voltage to the first set of word lines. In some examples, the word line component 625 may be configured as or otherwise support a means for applying, during a second duration after the first duration, a second voltage to the first set of word lines, where, during the second duration, at least one memory cell of a second subset of the first tier of memory cells thresholds and the at least one memory cell of the first subset of the first tier of memory cells is written to a first logic state based at least in part on applying the second voltage to the first set of word lines. In some examples, the word line component 625 may be configured as or otherwise support a means for applying, during a third duration after the second duration, a third voltage to the first set of word lines, where, during the third duration, the at least one memory cell of the second subset of the first tier of memory cells is written to a second logic state based at least in part on applying the third voltage to the first set of word lines.

In some examples, the bit line component 630 may be configured as or otherwise support a means for applying, to a first subset of bit lines of a plurality of bit lines that are coupled with the first tier of memory cells by the plurality of pillars, a first sequence of voltages during the first duration, the second duration, the third duration, or a combination thereof, where the at least one memory cell of the first subset of the first tier of memory cells thresholds and is written to the first logic state based at least in part on applying the first sequence of voltages. In some examples, the bit line component 630 may be configured as or otherwise support a means for applying, to a second subset of bit lines of the plurality of bit lines, a second sequence of voltages during the first duration, the second duration, the third duration, or a combination thereof, where the at least one memory cell of the second subset of the first tier of memory cells thresholds and is written to the second logic state based at least in part on applying the second sequence of voltages.

In some examples, the pillar component 635 may be configured as or otherwise support a means for applying, during the first duration, the second duration, and the third duration, a fourth voltage to a conductive line to activate a set of pillar selectors, where the first subset of the first tier of memory cells and the second subset of the first tier of memory cells are coupled with a first subset of pillars of the plurality of pillars that are coupled with the set of pillar selectors, and where the at least one memory cell of the first subset of the first tier of memory cells thresholds and is written to the first logic state and the at least one memory cell of the second subset of the first tier of memory cells thresholds and is written to the second logic state based at least in part on applying the fourth voltage.

In some examples, the at least one memory cell of the second subset of the first tier of memory cells thresholds concurrently with the at least one memory cell of the first subset of the first tier of memory cells being written to the first logic state.

In some examples, during the first duration, a plurality of memory cells of the first subset of the first tier of memory cells concurrently threshold based at least in part on applying the first voltage to the first set of word lines. In some examples, during the second duration, the plurality of memory cells of the first subset of the first tier of memory cells are concurrently written to the first logic state based at least in part on applying the second voltage to the first set of word lines.

In some examples, during the second duration, a plurality of memory cells of the second subset of the first tier of memory cells concurrently threshold based at least in part on applying the second voltage to the first set of word lines. In some examples, during the third duration, the plurality of memory cells of the second subset of the first tier of memory cells are concurrently written to the second logic state based at least in part on applying the third voltage to the first set of word lines.

In some examples, each memory cell of the first subset of the first tier of memory cells and the second subset of the first tier of memory cells is coupled with a different word line of the first set of word lines.

In some examples, the first voltage and the third voltage have a first polarity. In some examples, the second voltage has a second polarity that is different than the first polarity.

In some examples, a magnitude of the first voltage is less than a second magnitude of the second voltage, a third magnitude of the third voltage, or a combination thereof.

Figure 7:
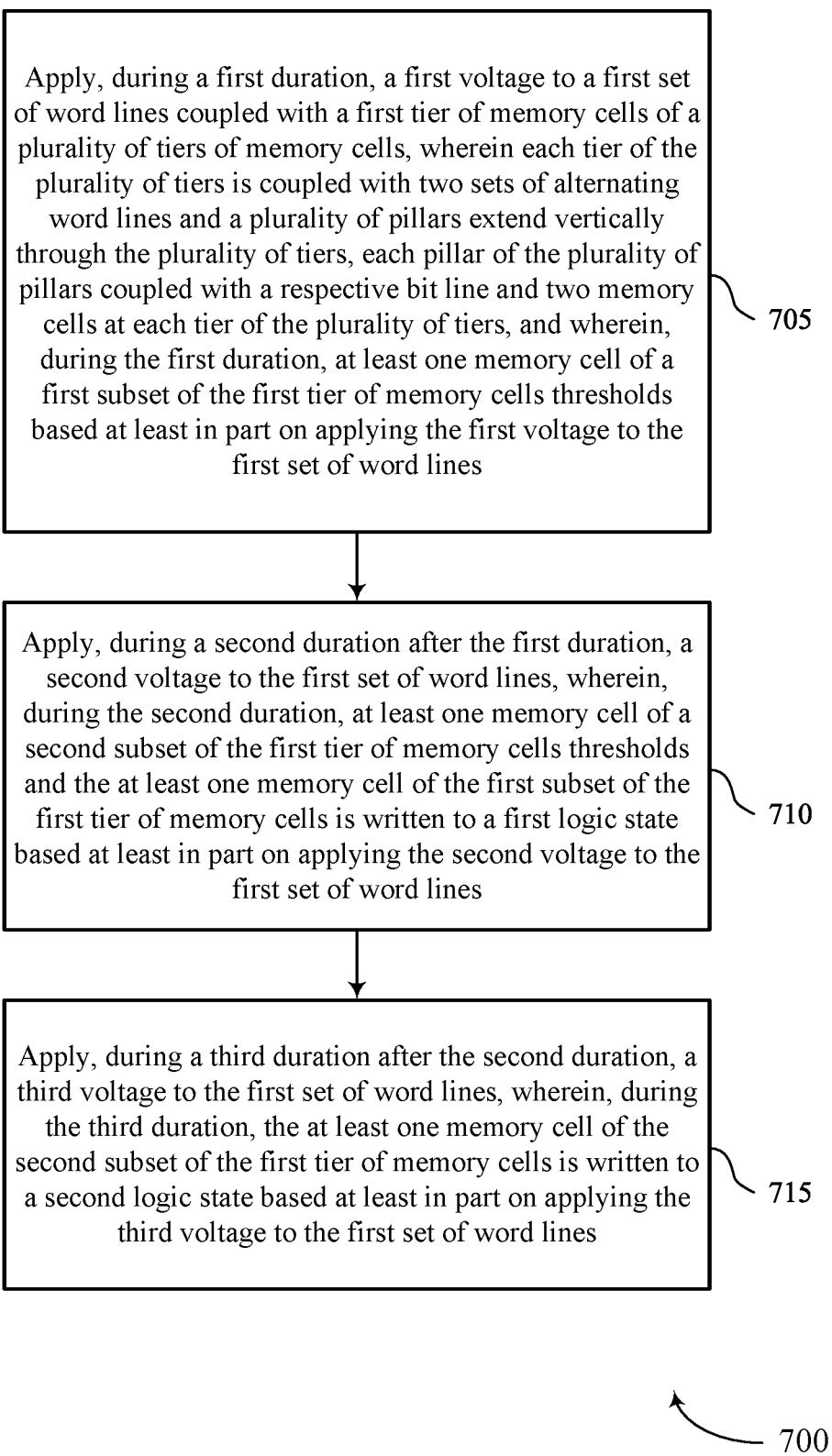
FIG. 7 shows a flowchart illustrating a method or methods that support techniques for parallel memory cell access in accordance with examples as disclosed herein.

FIG. 7 shows a flowchart illustrating a method 700 that supports techniques for parallel memory cell access in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include applying, during a first duration, a first voltage to a first set of word lines coupled with a first tier of memory cells of a plurality of tiers of memory cells, where each tier of the plurality of tiers is coupled with two sets of alternating word lines and a plurality of pillars extend vertically through the plurality of tiers, each pillar of the plurality of pillars coupled with a respective bit line and two memory cells at each tier of the plurality of tiers, and where, during the first duration, at least one memory cell of a first subset of the first tier of memory cells thresholds based at least in part on applying the first voltage to the first set of word lines. The operations of 705 may be performed in accordance with examples as disclosed herein. In some examples, aspects of the operations of 705 may be performed by a word line component 625 as described with reference to FIG. 6.

At 710, the method may include applying, during a second duration after the first duration, a second voltage to the first set of word lines, where, during the second duration, at least one memory cell of a second subset of the first tier of memory cells thresholds and the at least one memory cell of the first subset of the first tier of memory cells is written to a first logic state based at least in part on applying the second voltage to the first set of word lines. The operations of 710 may be performed in accordance with examples as disclosed herein. In some examples, aspects of the operations of 710 may be performed by a word line component 625 as described with reference to FIG. 6.

At 715, the method may include applying, during a third duration after the second duration, a third voltage to the first set of word lines, where, during the third duration, the at least one memory cell of the second subset of the first tier of memory cells is written to a second logic state based at least in part on applying the third voltage to the first set of word lines. The operations of 715 may be performed in accordance with examples as disclosed herein. In some examples, aspects of the operations of 715 may be performed by a word line component 625 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying, during a first duration, a first voltage to a first set of word lines coupled with a first tier of memory cells of a plurality of tiers of memory cells, where each tier of the plurality of tiers is coupled with two sets of alternating word lines and a plurality of pillars extend vertically through the plurality of tiers, each pillar of the plurality of pillars coupled with a respective bit line and two memory cells at each tier of the plurality of tiers, and where, during the first duration, at least one memory cell of a first subset of the first tier of memory cells thresholds based at least in part on applying the first voltage to the first set of word lines; applying, during a second duration after the first duration, a second voltage to the first set of word lines, where, during the second duration, at least one memory cell of a second subset of the first tier of memory cells thresholds and the at least one memory cell of the first subset of the first tier of memory cells is written to a first logic state based at least in part on applying the second voltage to the first set of word lines; and applying, during a third duration after the second duration, a third voltage to the first set of word lines, where, during the third duration, the at least one memory cell of the second subset of the first tier of memory cells is written to a second logic state based at least in part on applying the third voltage to the first set of word lines.

Aspect 2: The method, apparatus, or non-transitory computer-readable medium of aspect 1, further including operations, features, circuitry, logic, means, or instructions, or any combination thereof for applying, to a first subset of bit lines of a plurality of bit lines that are coupled with the first tier of memory cells by the plurality of pillars, a first sequence of voltages during the first duration, the second duration, the third duration, or a combination thereof, where the at least one memory cell of the first subset of the first tier of memory cells thresholds and is written to the first logic state based at least in part on applying the first sequence of voltages and applying, to a second subset of bit lines of the plurality of bit lines, a second sequence of voltages during the first duration, the second duration, the third duration, or a combination thereof, where the at least one memory cell of the second subset of the first tier of memory cells thresholds and is written to the second logic state based at least in part on applying the second sequence of voltages.

Aspect 3: The method, apparatus, or non-transitory computer-readable medium of any of aspects 1 through 2, further including operations, features, circuitry, logic, means, or instructions, or any combination thereof for applying, during the first duration, the second duration, and the third duration, a fourth voltage to a conductive line to activate a set of pillar selectors, where the first subset of the first tier of memory cells and the second subset of the first tier of memory cells are coupled with a first subset of pillars of the plurality of pillars that are coupled with the set of pillar selectors, and where the at least one memory cell of the first subset of the first tier of memory cells thresholds and is written to the first logic state and the at least one memory cell of the second subset of the first tier of memory cells thresholds and is written to the second logic state based at least in part on applying the fourth voltage.

Aspect 4: The method, apparatus, or non-transitory computer-readable medium of any of aspects 1 through 3 where the at least one memory cell of the second subset of the first tier of memory cells thresholds concurrently with the at least one memory cell of the first subset of the first tier of memory cells being written to the first logic state.

Aspect 5: The method, apparatus, or non-transitory computer-readable medium of any of aspects 1 through 4 where, during the first duration, a plurality of memory cells of the first subset of the first tier of memory cells concurrently threshold based at least in part on applying the first voltage to the first set of word lines, and where, during the second duration, the plurality of memory cells of the first subset of the first tier of memory cells are concurrently written to the first logic state based at least in part on applying the second voltage to the first set of word lines.

Aspect 6: The method, apparatus, or non-transitory computer-readable medium of any of aspects 1 through 5 where, during the second duration, a plurality of memory cells of the second subset of the first tier of memory cells concurrently threshold based at least in part on applying the second voltage to the first set of word lines, and where, during the third duration, the plurality of memory cells of the second subset of the first tier of memory cells are concurrently written to the second logic state based at least in part on applying the third voltage to the first set of word lines.

Aspect 7: The method, apparatus, or non-transitory computer-readable medium of any of aspects 1 through 6 where each memory cell of the first subset of the first tier of memory cells and the second subset of the first tier of memory cells is coupled with a different word line of the first set of word lines.

Aspect 8: The method, apparatus, or non-transitory computer-readable medium of any of aspects 1 through 7 where the first voltage and the third voltage have a first polarity and the second voltage has a second polarity that is different than the first polarity.

Aspect 9: The method, apparatus, or non-transitory computer-readable medium of any of aspects 1 through 8 where a magnitude of the first voltage is less than a second magnitude of the second voltage, a third magnitude of the third voltage, or a combination thereof.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 10: An apparatus, including: a plurality of pillars extending vertically through a plurality of tiers of memory cells, each pillar of the plurality of pillars coupled with two memory cells at each tier of the plurality of tiers; a plurality of bit lines; a plurality of sets of pillar selectors, each set of pillar selectors associated with a respective conductive line configured to control activation of the set of pillar selectors, where a set of pillar selectors is configured to couple a subset of pillars of the plurality of pillars with the plurality of bit lines based at least in part on being activated; a plurality of sets of word lines, each tier of memory cells coupled with two sets of word lines of the plurality of sets of word lines; and a controller coupled with the plurality of bit lines, the plurality of sets of pillar selectors, and the plurality of sets of word lines and operable to cause the apparatus to: apply, during a first duration, a first voltage to a first set of word lines of the plurality of sets of word lines coupled with a first tier of memory cells of the plurality of tiers of memory cells, where, during the first duration, at least one memory cell of a first subset of the first tier of memory cells thresholds based at least in part on applying the first voltage to the first set of word lines; apply, during a second duration after the first duration, a second voltage to the first set of word lines, where, during the second duration, at least one memory cell of a second subset of the first tier of memory cells thresholds and the at least one memory cell of the first subset of the first tier of memory cells is written to a first logic state based at least in part on applying the second voltage to the first set of word lines; and apply, during a third duration after the second duration, a third voltage to the first set of word lines, where, during the third duration, the at least one memory cell of the second subset of the first tier of memory cells is written to a second logic state based at least in part on applying the third voltage to the first set of word lines.

Aspect 11: The apparatus of aspect 10, where the controller is further configured to: apply a first sequence of voltages to a first subset of the plurality of bit lines during the first duration, the second duration, the third duration, or a combination thereof, where the at least one memory cell of the first subset of the first tier of memory cells thresholds and is written to the first logic state based at least in part on applying the first sequence of voltages; and apply a second sequence of voltages to a second subset of the plurality of bit lines during the first duration, the second duration, the third duration, or a combination thereof, where the at least one memory cell of the second subset of the first tier of memory cells thresholds and is written to the second logic state based at least in part on applying the second sequence of voltages.

Aspect 12: The apparatus of any of aspects 10 through 11, where the controller is further configured to: apply, during the first duration, the second duration, and the third duration, a fourth voltage to a first conductive line to activate a first set of pillar selectors, where the first subset of the first tier of memory cells and the second subset of the first tier of memory cells are coupled with a first subset of pillars of the plurality of pillars that are coupled with the first set of pillar selectors, and where the at least one memory cell of the first subset of the first tier of memory cells thresholds and is written to the first logic state and the at least one memory cell of the second subset of the first tier of memory cells thresholds and is written to the second logic state based at least in part on applying the fourth voltage.

Aspect 13: The apparatus of any of aspects 10 through 12, where the at least one memory cell of the second subset of the first tier of memory cells thresholds concurrently with the at least one memory cell of the first subset of the first tier of memory cells being written to the first logic state.

Aspect 14: The apparatus of any of aspects 10 through 13, where, during the first duration, a plurality of memory cells of the first subset of the first tier of memory cells concurrently threshold based at least in part on applying the first voltage to the first set of word lines, and where, during the second duration, the plurality of memory cells of the first subset of the first tier of memory cells are concurrently written to the first logic state based at least in part on applying the second voltage to the first set of word lines.

Aspect 15: The apparatus of any of aspects 10 through 14, where, during the second duration, a plurality of memory cells of the second subset of the first tier of memory cells concurrently threshold based at least in part on applying the second voltage to the first set of word lines, and where, during the third duration, the plurality of memory cells of the second subset of the first tier of memory cells are concurrently written to the second logic state based at least in part on applying the third voltage to the first set of word lines.

Aspect 16: The apparatus of any of aspects 10 through 15, where each memory cell of the first subset of the first tier of memory cells and the second subset of the first tier of memory cells is coupled with a different word line of the first set of word lines.

Aspect 17: The apparatus of any of aspects 10 through 16, where: the first voltage and the third voltage have a first polarity, and the second voltage has a second polarity that is different than the first polarity.

Aspect 18: The apparatus of any of aspects 10 through 17, where a magnitude of the first voltage is less than a second magnitude of the second voltage, a third magnitude of the third voltage, or both.

Aspect 19: The apparatus of any of aspects 10 through 18, where a second set of word lines coupled with the first tier of memory cells are undriven during the first duration, the second duration, and the third duration, and a third subset of the first tier of memory cells coupled with the second set of word lines are unselected during the first duration, the second duration, and the third duration based at least in part on the second set of word lines being undriven.

An apparatus is described. The following provides an overview of aspects of the apparatus as described herein:

Aspect 20: An apparatus, including: a plurality of pillars extending vertically through a plurality of tiers of memory cells, each pillar of the plurality of pillars coupled with two memory cells at each tier of the plurality of tiers; a plurality of bit lines; a plurality of sets of pillar selectors, each set of pillar selectors associated with a respective conductive line configured to control activation of the set of pillar selectors, where activation of a set of pillar selectors couples a subset of pillars of the plurality of pillars with the plurality of bit lines; and a plurality of word line drivers coupled with a plurality of sets of word lines, each tier of memory cells coupled with two sets of word lines of the plurality of sets of word lines, where a word line driver of the plurality of word line drivers is configured to: bias, during a first duration and to a first voltage, a first set of word lines of the plurality of sets of word lines coupled with the word line driver and a first tier of memory cells of the plurality of tiers of memory cells, where, during the first duration, at least one memory cell of a first subset of the first tier of memory cells thresholds based at least in part on biasing the first set of word lines to the first voltage; bias, during a second duration after the first duration, the first set of word lines to a second voltage, where, during the second duration, at least one memory cell of a second subset of the first tier of memory cells thresholds and the at least one memory cell of the first subset of the first tier of memory cells is written to a first logic state based at least in part on biasing the first set of word lines to the second voltage; and bias, during a third duration after the second duration, the first set of word lines to a third voltage, where, during the third duration, the at least one memory cell of the second subset of the first tier of memory cells is written to a second logic state based at least in part on biasing the first set of word lines to the third voltage.

Aspect 21: The apparatus of aspect 20, further including: a plurality of bit line drivers coupled with the plurality of bit lines, where a first subset of the plurality of bit line drivers are configured to: bias a first subset of the plurality of bit lines according to a first sequence of voltages during the first duration, the second duration, the third duration, or a combination thereof, where the at least one memory cell of the first subset of the first tier of memory cells thresholds and is written to the first logic state based at least in part on biasing the first subset of the plurality of bit lines according to the first sequence of voltages; and where a second subset of the plurality of bit line drivers are configured to: bias a second subset of the plurality of bit lines according to a second sequence of voltages during the first duration, the second duration, the third duration, or a combination thereof, where the at least one memory cell of the second subset of the first tier of memory cells thresholds and is written to the second logic state based at least in part on biasing the second subset of the plurality of bit lines according to the second sequence of voltages.

Aspect 22: The apparatus of any of aspects 20 through 21, further including: a pillar selector driver coupled with a first conductive line associated with a first set of pillar selectors of the plurality of sets of pillar selectors, where the pillar selector driver is configured to: bias, during the first duration, the second duration, and the third duration, the first conductive line to a fourth voltage to activate the first set of pillar selectors, where the first subset of the first tier of memory cells and the second subset of the first tier of memory cells are coupled with a first subset of pillars of the plurality of pillars that are coupled with the first set of pillar selectors, and where the at least one memory cell of the first subset of the first tier of memory cells thresholds and is written to the first logic state and the at least one memory cell of the second subset of the first tier of memory cells thresholds and is written to the second logic state based at least in part on biasing the first conductive line to the fourth voltage.

Aspect 23: The apparatus of any of aspects 20 through 22, where the at least one memory cell of the second subset of the first tier of memory cells thresholds concurrently with the at least one memory cell of the first subset of the first tier of memory cells being written to the first logic state.

Aspect 24: The apparatus of any of aspects 20 through 23, where, during the first duration, a plurality of memory cells of the first subset of the first tier of memory cells concurrently threshold based at least in part on biasing the first set of word lines to the first voltage, and where, during the second duration, the plurality of memory cells of the first subset of the first tier of memory cells are concurrently written to the first logic state based at least in part on biasing the first set of word lines to the second voltage.

Aspect 25: The apparatus of any of aspects 20 through 24, where, during the second duration, a plurality of memory cells of the second subset of the first tier of memory cells concurrently threshold based at least in part on biasing the first set of word lines to the second voltage, and where, during the third duration, the plurality of memory cells of the second subset of the first tier of memory cells are concurrently written to the second logic state based at least in part on biasing the first set of word lines to the third voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a plurality of pillars extending vertically through a plurality of tiers of memory cells, each pillar of the plurality of pillars coupled with two memory cells at each tier of the plurality of tiers;
   a plurality of bit lines;
   a plurality of sets of pillar selectors, each set of pillar selectors associated with a respective conductive line configured to control activation of the set of pillar selectors, wherein a set of pillar selectors is configured to couple a subset of pillars of the plurality of pillars with the plurality of bit lines based at least in part on being activated;
   a plurality of sets of word lines, each tier of memory cells coupled with two sets of word lines of the plurality of sets of word lines; and
   a controller coupled with the plurality of bit lines, the plurality of sets of pillar selectors, and the plurality of sets of word lines and operable to cause the apparatus to:
      apply, during a first duration, a first voltage to a first set of word lines of the plurality of sets of word lines coupled with a first tier of memory cells of the plurality of tiers of memory cells, wherein, during the first duration, at least one memory cell of a first subset of the first tier of memory cells thresholds based at least in part on applying the first voltage to the first set of word lines;
      apply, during a second duration after the first duration, a second voltage to the first set of word lines, wherein, during the second duration, at least one memory cell of a second subset of the first tier of memory cells thresholds and the at least one memory cell of the first subset of the first tier of memory cells is written to a first logic state based at least in part on applying the second voltage to the first set of word lines; and
      apply, during a third duration after the second duration, a third voltage to the first set of word lines, wherein, during the third duration, the at least one memory cell of the second subset of the first tier of memory cells is written to a second logic state based at least in part on applying the third voltage to the first set of word lines.

2. The apparatus of claim 1, wherein the controller is further configured to:
   apply a first sequence of voltages to a first subset of the plurality of bit lines during the first duration, the second duration, the third duration, or a combination thereof, wherein the at least one memory cell of the first subset of the first tier of memory cells thresholds and is written to the first logic state based at least in part on applying the first sequence of voltages; and
   apply a second sequence of voltages to a second subset of the plurality of bit lines during the first duration, the second duration, the third duration, or a combination thereof, wherein the at least one memory cell of the second subset of the first tier of memory cells thresholds and is written to the second logic state based at least in part on applying the second sequence of voltages.

3. The apparatus of claim 1, wherein the controller is further configured to:
   apply, during the first duration, the second duration, and the third duration, a fourth voltage to a first conductive line to activate a first set of pillar selectors, wherein the first subset of the first tier of memory cells and the second subset of the first tier of memory cells are coupled with a first subset of pillars of the plurality of pillars that are coupled with the first set of pillar selectors, and
   wherein the at least one memory cell of the first subset of the first tier of memory cells thresholds and is written to the first logic state and the at least one memory cell of the second subset of the first tier of memory cells thresholds and is written to the second logic state based at least in part on applying the fourth voltage.

4. The apparatus of claim 1, wherein the at least one memory cell of the second subset of the first tier of memory cells thresholds concurrently with the at least one memory cell of the first subset of the first tier of memory cells being written to the first logic state.

5. The apparatus of claim 1, wherein, during the first duration, a plurality of memory cells of the first subset of the first tier of memory cells concurrently threshold based at least in part on applying the first voltage to the first set of word lines, and wherein, during the second duration, the plurality of memory cells of the first subset of the first tier of memory cells are concurrently written to the first logic state based at least in part on applying the second voltage to the first set of word lines.

6. The apparatus of claim 1, wherein, during the second duration, a plurality of memory cells of the second subset of the first tier of memory cells concurrently threshold based at least in part on applying the second voltage to the first set of word lines, and wherein, during the third duration, the plurality of memory cells of the second subset of the first tier of memory cells are concurrently written to the second logic state based at least in part on applying the third voltage to the first set of word lines.

7. The apparatus of claim 1, wherein each memory cell of the first subset of the first tier of memory cells and the second subset of the first tier of memory cells is coupled with a different word line of the first set of word lines.

8. The apparatus of claim 1, wherein:
   the first voltage and the third voltage have a first polarity, and
   the second voltage has a second polarity that is different than the first polarity.

9. The apparatus of claim 1, wherein a magnitude of the first voltage is less than a second magnitude of the second voltage, a third magnitude of the third voltage, or both.

10. The apparatus of claim 1, wherein a second set of word lines coupled with the first tier of memory cells are undriven during the first duration, the second duration, and the third duration, and wherein a third subset of the first tier of memory cells coupled with the second set of word lines are unselected during the first duration, the second duration, and the third duration based at least in part on the second set of word lines being undriven.

11. A method, comprising:
   applying, during a first duration, a first voltage to a first set of word lines coupled with a first tier of memory cells of a plurality of tiers of memory cells, wherein each tier of the plurality of tiers is coupled with two sets of alternating word lines and a plurality of pillars extend vertically through the plurality of tiers, each pillar of the plurality of pillars coupled with a respective bit line and two memory cells at each tier of the plurality of tiers, and wherein, during the first duration, at least one memory cell of a first subset of the first tier of memory cells thresholds based at least in part on applying the first voltage to the first set of word lines;

applying, during a second duration after the first duration, a second voltage to the first set of word lines, wherein, during the second duration, at least one memory cell of a second subset of the first tier of memory cells thresholds and the at least one memory cell of the first subset of the first tier of memory cells is written to a first logic state based at least in part on applying the second voltage to the first set of word lines; and applying, during a third duration after the second duration, a third voltage to the first set of word lines, wherein, during the third duration, the at least one memory cell of the second subset of the first tier of memory cells is written to a second logic state based at least in part on applying the third voltage to the first set of word lines.

12. The method of claim 11, further comprising:

applying, to a first subset of bit lines of a plurality of bit lines that are coupled with the first tier of memory cells by the plurality of pillars, a first sequence of voltages during the first duration, the second duration, the third duration, or a combination thereof, wherein the at least one memory cell of the first subset of the first tier of memory cells thresholds and is written to the first logic state based at least in part on applying the first sequence of voltages; and applying, to a second subset of bit lines of the plurality of bit lines, a second sequence of voltages during the first duration, the second duration, the third duration, or a combination thereof, wherein the at least one memory cell of the second subset of the first tier of memory cells thresholds and is written to the second logic state based at least in part on applying the second sequence of voltages.

13. The method of claim 11, further comprising:

apply, during the first duration, the second duration, and the third duration, a fourth voltage to a conductive line to activate a set of pillar selectors, wherein the first subset of the first tier of memory cells and the second subset of the first tier of memory cells are coupled with a first subset of pillars of the plurality of pillars that are coupled with the set of pillar selectors, and wherein the at least one memory cell of the first subset of the first tier of memory cells thresholds and is written to the first logic state and the at least one memory cell of the second subset of the first tier of memory cells thresholds and is written to the second logic state based at least in part on applying the fourth voltage.

14. The method of claim 11, wherein the at least one memory cell of the second subset of the first tier of memory cells thresholds concurrently with the at least one memory cell of the first subset of the first tier of memory cells being written to the first logic state.

15. The method of claim 11, wherein, during the first duration, a plurality of memory cells of the first subset of the first tier of memory cells concurrently threshold based at least in part on applying the first voltage to the first set of word lines, and wherein, during the second duration, the plurality of memory cells of the first subset of the first tier of memory cells are concurrently written to the first logic state based at least in part on applying the second voltage to the first set of word lines.

16. The method of claim 11, wherein, during the second duration, a plurality of memory cells of the second subset of the first tier of memory cells concurrently threshold based at least in part on applying the second voltage to the first set of word lines, and wherein, during the third duration, the plurality of memory cells of the second subset of the first tier of memory cells are concurrently written to the second logic state based at least in part on applying the third voltage to the first set of word lines.

17. The method of claim 11, wherein each memory cell of the first subset of the first tier of memory cells and the second subset of the first tier of memory cells is coupled with a different word line of the first set of word lines.

18. The method of claim 11, wherein:

the first voltage and the third voltage have a first polarity, and the second voltage has a second polarity that is different than the first polarity.

19. The method of claim 11, wherein a magnitude of the first voltage is less than a second magnitude of the second voltage, a third magnitude of the third voltage, or a combination thereof.

20. An apparatus, comprising:

a plurality of pillars extending vertically through a plurality of tiers of memory cells, each pillar of the plurality of pillars coupled with two memory cells at each tier of the plurality of tiers;

a plurality of bit lines;

a plurality of sets of pillar selectors, each set of pillar selectors associated with a respective conductive line configured to control activation of the set of pillar selectors, wherein activation of a set of pillar selectors couples a subset of pillars of the plurality of pillars with the plurality of bit lines; and a plurality of word line drivers coupled with a plurality of sets of word lines, each tier of memory cells coupled with two sets of word lines of the plurality of sets of word lines, wherein a word line driver of the plurality of word line drivers is configured to:

bias, during a first duration and to a first voltage, a first set of word lines of the plurality of sets of word lines coupled with the word line driver and a first tier of memory cells of the plurality of tiers of memory cells, wherein, during the first duration, at least one memory cell of a first subset of the first tier of memory cells thresholds based at least in part on biasing the first set of word lines to the first voltage;

bias, during a second duration after the first duration, the first set of word lines to a second voltage, wherein, during the second duration, at least one memory cell of a second subset of the first tier of memory cells thresholds and the at least one memory cell of the first subset of the first tier of memory cells is written to a first logic state based at least in part on biasing the first set of word lines to the second voltage; and bias, during a third duration after the second duration, the first set of word lines to a third voltage, wherein, during the third duration, the at least one memory cell of the second subset of the first tier of memory cells is written to a second logic state based at least in part on biasing the first set of word lines to the third voltage.

21. The apparatus of claim 20, further comprising:

a plurality of bit line drivers coupled with the plurality of bit lines, wherein a first subset of the plurality of bit line drivers are configured to:

bias a first subset of the plurality of bit lines according to a first sequence of voltages during the first duration, the second duration, the third duration, or a combination thereof, wherein the at least one memory cell of the first subset of the first tier of memory cells thresholds and is written to the first logic state based at least in part on biasing the first subset of the plurality of bit lines according to the first sequence of voltages; and wherein a second subset of the plurality of bit line drivers are configured to:
bias a second subset of the plurality of bit lines according to a second sequence of voltages during the first duration, the second duration, the third duration, or a combination thereof, wherein the at least one memory cell of the second subset of the first tier of memory cells thresholds and is written to the second logic state based at least in part on biasing the second subset of plurality of bit lines according to the second sequence of voltages.

22. The apparatus of claim 20, further comprising:
a pillar selector driver coupled with a first conductive line associated with a first set of pillar selectors of the plurality of sets of pillar selectors,
wherein the pillar selector driver is configured to:
bias, during the first duration, the second duration, and the third duration, the first conductive line to a fourth voltage to activate the first set of pillar selectors,
wherein the first subset of the first tier of memory cells and the second subset of the first tier of memory cells are coupled with a first subset of pillars of the plurality of pillars that are coupled with the first set of pillar selectors, and wherein the at least one memory cell of the first subset of the first tier of memory cells thresholds and is written to the first logic state and the at least one memory cell of the second subset of the first tier of memory cells thresholds and is written to the second logic state based at least in part on biasing the first conductive line to the fourth voltage.

23. The apparatus of claim 20, wherein the at least one memory cell of the second subset of the first tier of memory cells thresholds concurrently with the at least one memory cell of the first subset of the first tier of memory cells being written to the first logic state.

24. The apparatus of claim 20, wherein, during the first duration, a plurality of memory cells of the first subset of the first tier of memory cells concurrently threshold based at least in part on biasing the first set of word lines to the first voltage, and wherein, during the second duration, the plurality of memory cells of the first subset of the first tier of memory cells are concurrently written to the first logic state based at least in part on biasing the first set of word lines to the second voltage.

25. The apparatus of claim 20, wherein, during the second duration, a plurality of memory cells of the second subset of the first tier of memory cells concurrently threshold based at least in part on biasing the first set of word lines to the second voltage, and wherein, during the third duration, the plurality of memory cells of the second subset of the first tier of memory cells are concurrently written to the second logic state based at least in part on biasing the first set of word lines to the third voltage.

* * * * *